(12) United States Patent
Baker

(10) Patent No.: US 8,717,220 B2
(45) Date of Patent: *May 6, 2014

(54) METHODS OF QUANTIZING SIGNALS USING VARIABLE REFERENCE SIGNALS

(75) Inventor: R. Jacob Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 222 days.

This patent is subject to a terminal disclaimer.

(21) Appl. No.: 13/306,868

(22) Filed: Nov. 29, 2011

(65) Prior Publication Data

US 2012/0068872 A1    Mar. 22, 2012

Related U.S. Application Data

(60) Continuation of application No. 12/776,242, filed on May 7, 2010, now Pat. No. 8,068,046, which is a division of application No. 11/818,995, filed on Jun. 15, 2007, now Pat. No. 7,733,262.

(51) Int. Cl.
    *H03M 1/56*    (2006.01)
(52) U.S. Cl.
    USPC ........... 341/169; 341/136; 341/155; 341/160; 341/165; 382/124; 365/207; 365/189.15
(58) Field of Classification Search
    USPC ............... 341/130–165; 382/124; 365/207; 365/189.15
    See application file for complete search history.

(56) References Cited

U.S. PATENT DOCUMENTS

| | | |
|---|---|---|
| 5,600,319 A | 2/1997 | Ginetti |
| 5,614,856 A | 3/1997 | Wilson et al. |
| 5,953,276 A | 9/1999 | Baker |
| 6,044,019 A | 3/2000 | Cernea et al. |
| 6,188,340 B1 | 2/2001 | Matsumoto et al. |
| 6,282,120 B1 | 8/2001 | Cernea et al. |
| 6,490,200 B2 | 12/2002 | Cernea et al. |
| 6,504,750 B1 | 1/2003 | Baker |
| 6,567,297 B2 | 5/2003 | Baker |
| 6,577,525 B2 | 6/2003 | Baker |
| 6,597,600 B2 | 7/2003 | Baker |
| 6,661,708 B2 | 12/2003 | Cernea et al. |
| 6,664,708 B2 | 12/2003 | Shlimak et al. |
| 6,665,013 B1 | 12/2003 | Fossum et al. |
| 6,741,490 B2 | 5/2004 | Baker |
| 6,741,502 B1 | 5/2004 | Cernea |
| 6,781,906 B2 | 8/2004 | Perner et al. |
| 6,785,156 B2 | 8/2004 | Baker |
| 6,795,359 B1 | 9/2004 | Baker |

(Continued)

OTHER PUBLICATIONS

Rane Corporation, RaneNote 137, "Digital Charma of Audio A/D Converters," 1997, 12 pgs.

(Continued)

*Primary Examiner* — Lam T Mai
(74) *Attorney, Agent, or Firm* — Fletcher Yoder, P.C.

(57) ABSTRACT

Methods for reading a data location coupled to an electrical conductor. A counter receives a signal from an analog-to-digital converter coupled to the electrical conductor. The counter produces two or more counts, and in some embodiments, the counts are based in part on a variable reference voltage. An interfuser may be coupled to an output of the counter. The interfuser receives the two or more counts from the counter and reads data conveyed by the data location based on the two or more counts.

20 Claims, 17 Drawing Sheets

(56) References Cited

U.S. PATENT DOCUMENTS

| | | |
|---|---|---|
| 6,798,705 B2 | 9/2004 | Baker |
| 6,807,403 B2 | 10/2004 | Tanaka |
| 6,813,208 B2 | 11/2004 | Baker |
| 6,822,892 B2 | 11/2004 | Baker |
| 6,826,102 B2 | 11/2004 | Baker |
| 6,829,188 B2 | 12/2004 | Baker |
| 6,847,234 B2 | 1/2005 | Choi |
| 6,850,441 B2 | 2/2005 | Mokhlesi et al. |
| 6,856,564 B2 | 2/2005 | Baker |
| 6,859,383 B2 | 2/2005 | Baker |
| 6,870,784 B2 | 3/2005 | Baker |
| 6,885,580 B2 | 4/2005 | Baker |
| 6,901,020 B2 | 5/2005 | Baker |
| 6,914,838 B2 | 7/2005 | Baker |
| 6,917,537 B2 | 7/2005 | Bunyk |
| 6,930,942 B2 | 8/2005 | Baker |
| 6,954,390 B2 | 10/2005 | Baker |
| 6,954,391 B2 | 10/2005 | Baker |
| 6,954,392 B2 | 10/2005 | Baker |
| 6,977,601 B1 | 12/2005 | Fletcher et al. |
| 6,985,375 B2 | 1/2006 | Baker |
| 7,002,833 B2 | 2/2006 | Hush et al. |
| 7,009,901 B2 | 3/2006 | Baker |
| 7,062,075 B2 | 6/2006 | Morimura et al. |
| 7,095,667 B2 | 8/2006 | Baker |
| 7,098,823 B2 | 8/2006 | O'Dowd et al. |
| 7,102,932 B2 | 9/2006 | Baker |
| 7,133,307 B2 | 11/2006 | Baker |
| 7,151,689 B2 | 12/2006 | Baker |
| 7,151,698 B2 | 12/2006 | Baker |
| 7,330,390 B2 | 2/2008 | Baker |
| 7,366,021 B2 | 4/2008 | Taylor et al. |
| 7,372,717 B2 | 5/2008 | Baker |
| 7,456,885 B2 | 11/2008 | Baker |
| 7,538,702 B2 * | 5/2009 | Baker .......................... 341/142 |
| 7,733,262 B2 * | 6/2010 | Baker .......................... 341/164 |
| 8,068,046 B2 * | 11/2011 | Baker .......................... 341/169 |
| 8,089,387 B2 * | 1/2012 | Baker .......................... 341/155 |
| 2002/0194557 A1 | 12/2002 | Park |
| 2006/0227641 A1 | 10/2006 | Baker |
| 2006/0250853 A1 | 11/2006 | Taylor et al. |

OTHER PUBLICATIONS

Baker, R.J., (2001-2006) *Sensing, Circuits for Resistive Memory*, presented at various universities and companies.

Baker, "*CMOS Mixed Signal Circuit Design*," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "*Demystifying Sigma-Delta ADCs*" (Jan. 31, 2003), 15 pgs.

Baker, R.J., (2003) *Mixed-Signal Design in the Microelectronics Curriculum*. IEEE University/Government/Industry Microelectronics (UGIM) Symposium, Jun. 30-Jul. 2, 2003.

Baker, R.J. (2004) *Delta-Sigma Modulation for Sensing*, IEEE/EDS Workshop on Microelectronics and Electron Devices (WMED), Apr. 2004.

Baker, "*CMOS Circuit Design, Layout, and Simulation*," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

Hadrick, M. and Baker, R.J., (2005) *Sensing in CMOS Imagers using Delta-Sigma Modulation*, a general presentation of our work in this area.

Baker, R.J. (2005) *Design of High-Speed CMOS Op-Amps for Signal Processing*, IEEE/EDS Workshop on Microelectronics and Electron Devices (WMED), Apr. 2005.

Leslie, M.B., and Baker, R.J., (2006) "*Noise-Shaping Sense Amplifier MRAM Cross-Point Arrays*," IEEE Journal of Solid State Circuits, vol. 41, No. 3, pp. 699-704.

Duvvada, K., Saxena, V., and Baker, R. J., (2006) *High Speed Digital Input Buffer Circuits*, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) *Design and Fabrication of a MEMS Capacitive Chemical Sensor System*, proceedings of the IEEE/EDS Workshop on Microelectronics and Electron Devices (WMED), pp. 17-18, Apr. 2006.

Baker, R.J. and Saxena, V., (2007) *Design of Bandpass Delta Sigma Modulators: Avoiding Common Mistakes*, presented at various universities and companies.

Wikipedia—definition of "Error detection and correction", pulled from website Jun. 1, 2007, 9 pgs.

Wikipedia—definition of "Hamming code", pulled from website Jun. 1, 2007, 8 pgs.

Wikipedia—definition of "Linear feedback shift register (LFSR)," pulled from website Jun. 1, 2007, 4 pgs.

Park, "*Motorola Digital Signal Processors—Principles of Sigma-Delta Modulation for Analog-to-Digital Converters*," (Undated).

* cited by examiner

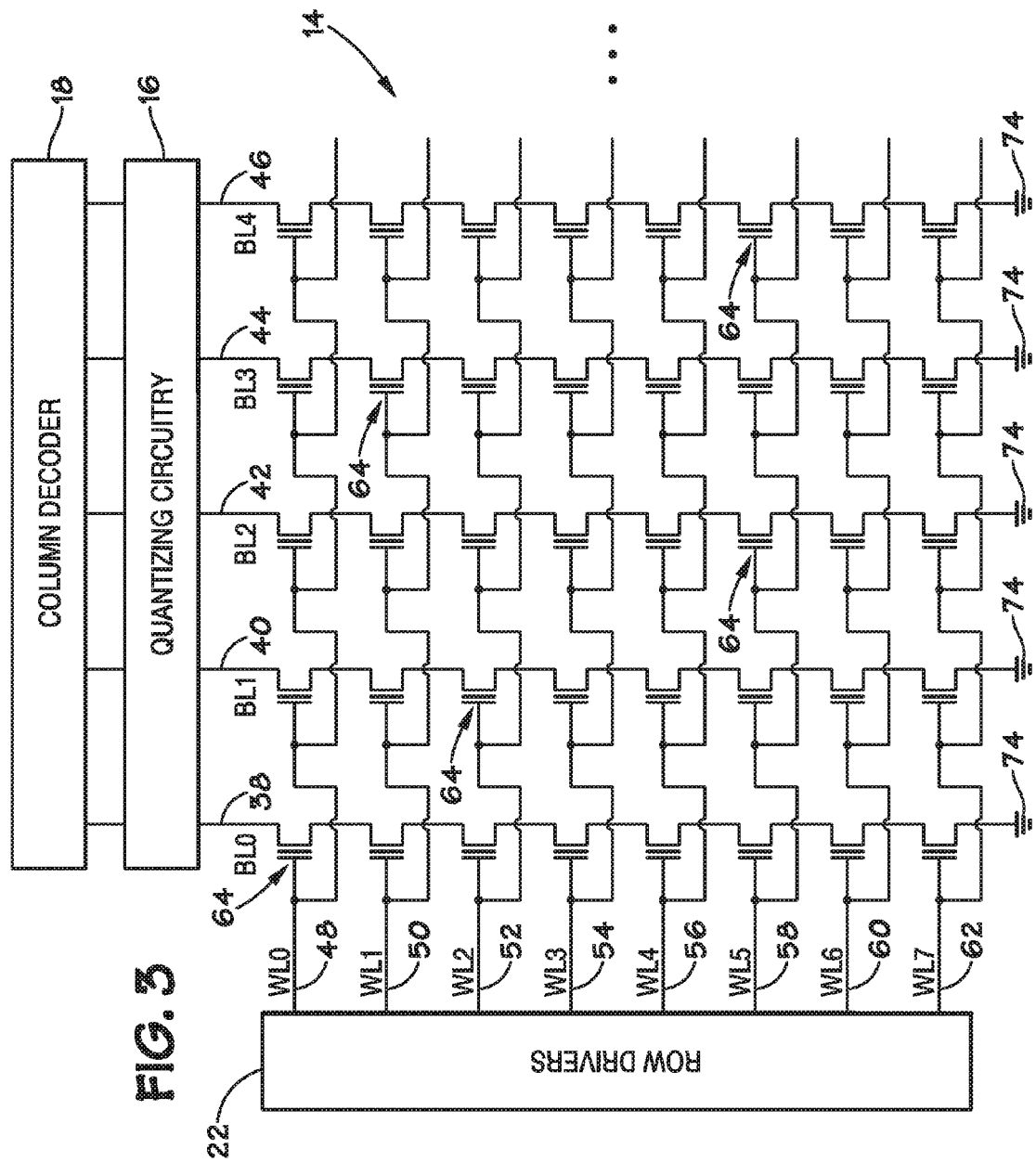

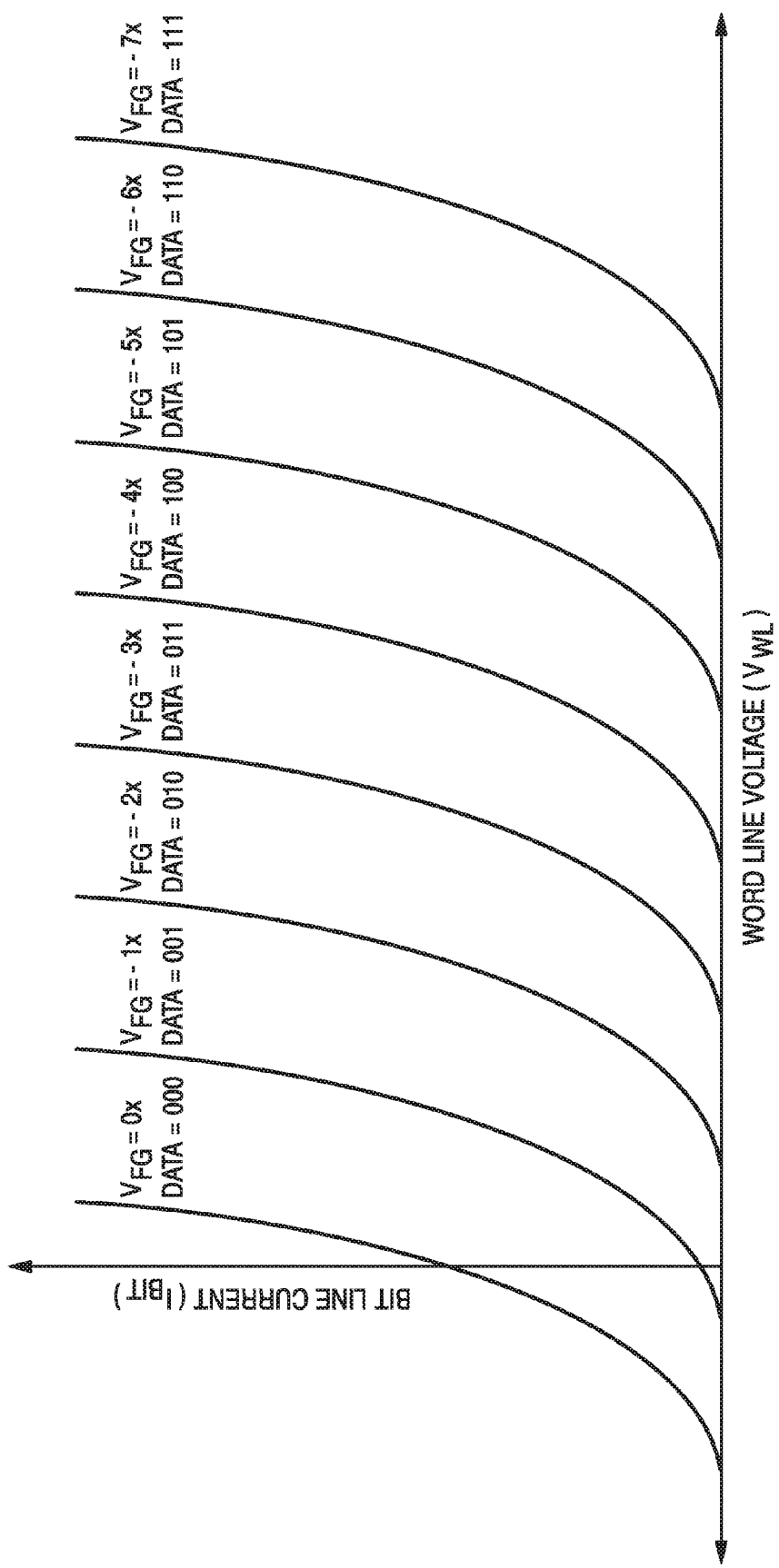

METHODS OF QUANTIZING SIGNALS USING VARIABLE REFERENCE SIGNALS

CROSS-REFERENCE TO RELATED APPLICATION

This application is a continuation of U.S. patent application Ser. No. 12/776,242, filed on May 7, 2010, now U.S. Pat. No. 8,068,046, which issued on Nov. 29, 2011, which is a divisional of U.S. patent application Ser. No. 11/818,995, which was filed on Jun. 15, 2007, now U.S. Pat. No. 7,733,262, which issued on Jun. 8, 2010.

BACKGROUND

1. Field of Invention

Embodiments of the present invention relate generally to devices and, more specifically, in a particular embodiment, to quantizing circuits with variable reference signals.

2. Description of Related Art

Generally, memory devices include an array of memory elements and associated sense amplifiers. The memory elements store data, and the sense amplifiers read the data from the memory elements. To read data, for example, a current is passed through the memory element, and the current or a resulting voltage is measured by the sense amplifier. Conventionally, the sense amplifier measures the current or voltage by comparing it to a reference current or voltage. Depending on whether the current or voltage is greater than the reference, the sense amplifier outputs a value of one or zero. That is, the sense amplifier quantizes the analog signal from the memory element into one of two logic states.

Many types of memory elements are capable of assuming more than just two states. For example, some memory elements are capable of multi-bit (e.g., more than two state) storage. For instance, rather than outputting either a high or low voltage, the memory element may output four or eight different voltage levels, each level corresponding to a different data value. However, conventional sense amplifiers often fail to distinguish accurately between the additional levels because the difference between the levels (e.g., a voltage difference) in a multi-bit memory element is often smaller than the difference between the levels in a single-bit (i.e., two state) memory element. Thus, conventional sense amplifiers often cannot read multi-bit memory elements. This problem may be increased as high performance multi-bit memory elements become increasingly dense, thereby reducing the size of the memory elements and the difference between the levels (e.g., voltage) to be sensed by the sense amplifiers.

A variety of factors may tend to prevent the sense amplifier from discerning small differences in the levels of a multi-bit memory element. For instance, noise in the power supply, ground, and reference voltage may cause an inaccurate reading of the memory element. The noise may have a variety of sources, such as temperature variations, parasitic signals, data dependent effects, and manufacturing process variations. This susceptibility to noise often leads a designer to reduce the number of readable states of the memory element, which tends to reduce memory density and increase the cost of memory.

Conventional sense amplifiers present similar problems in imaging devices. In these devices, an array of light sensors output a current or voltage in response to light impinging upon the sensor. The magnitude of the current or voltage typically depends upon the intensity of the light. Thus, the capacity of the sense amplifier to accurately convert the current or voltage into a digital signal may determine, in part, the fidelity of the captured image. Consequently, noise affecting the sense amplifier may diminish the performance of imaging devices.

BRIEF DESCRIPTION OF DRAWINGS

FIG. 3 illustrates a memory array in accordance with an embodiment of the present invention;

FIG. 5 illustrates I-V traces of memory elements storing different values, in accordance with an embodiment of the present invention;

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sense amplifiers discussed above. Some embodiments include a quantizing circuit configured to detect small differences in voltages and/or currents. As explained below, the quantizing circuit may sample the measured electrical parameter on multiple occasions and filter, e.g., average or sum, the samples to reduce the impact of noise. As a result, in some embodiments, the quantizing circuit may resolve small differences between voltage or current levels in multi-bit memory elements and/or light sensors, which may allow circuit designers to increase the number of bits stored per memory element and/or the sensitivity of an imaging device. Prior to describing these embodiments and their advantages, the environment in which they may operate is described.

Figure 1:
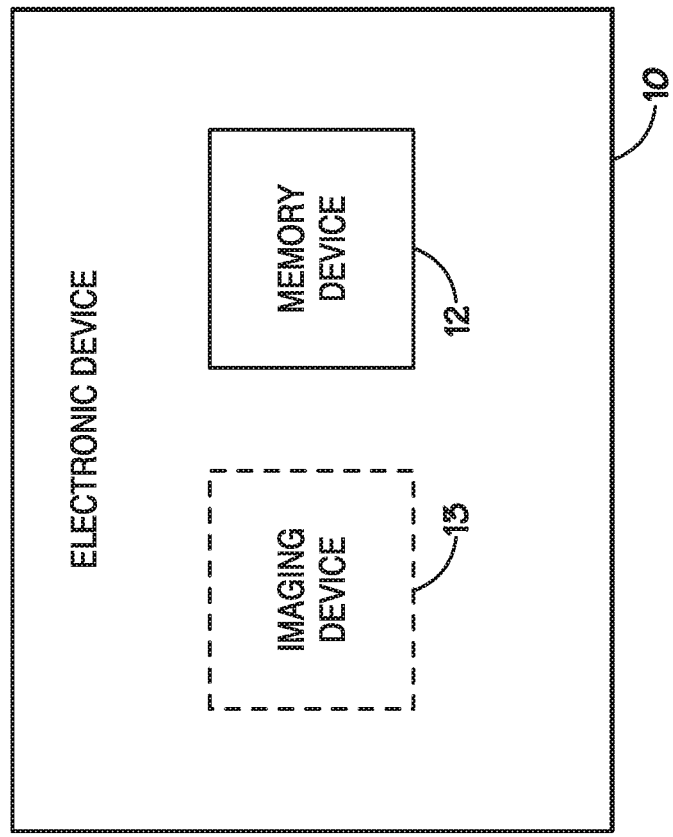
FIG. 1 illustrates an electronic device in accordance with an embodiment of the present invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
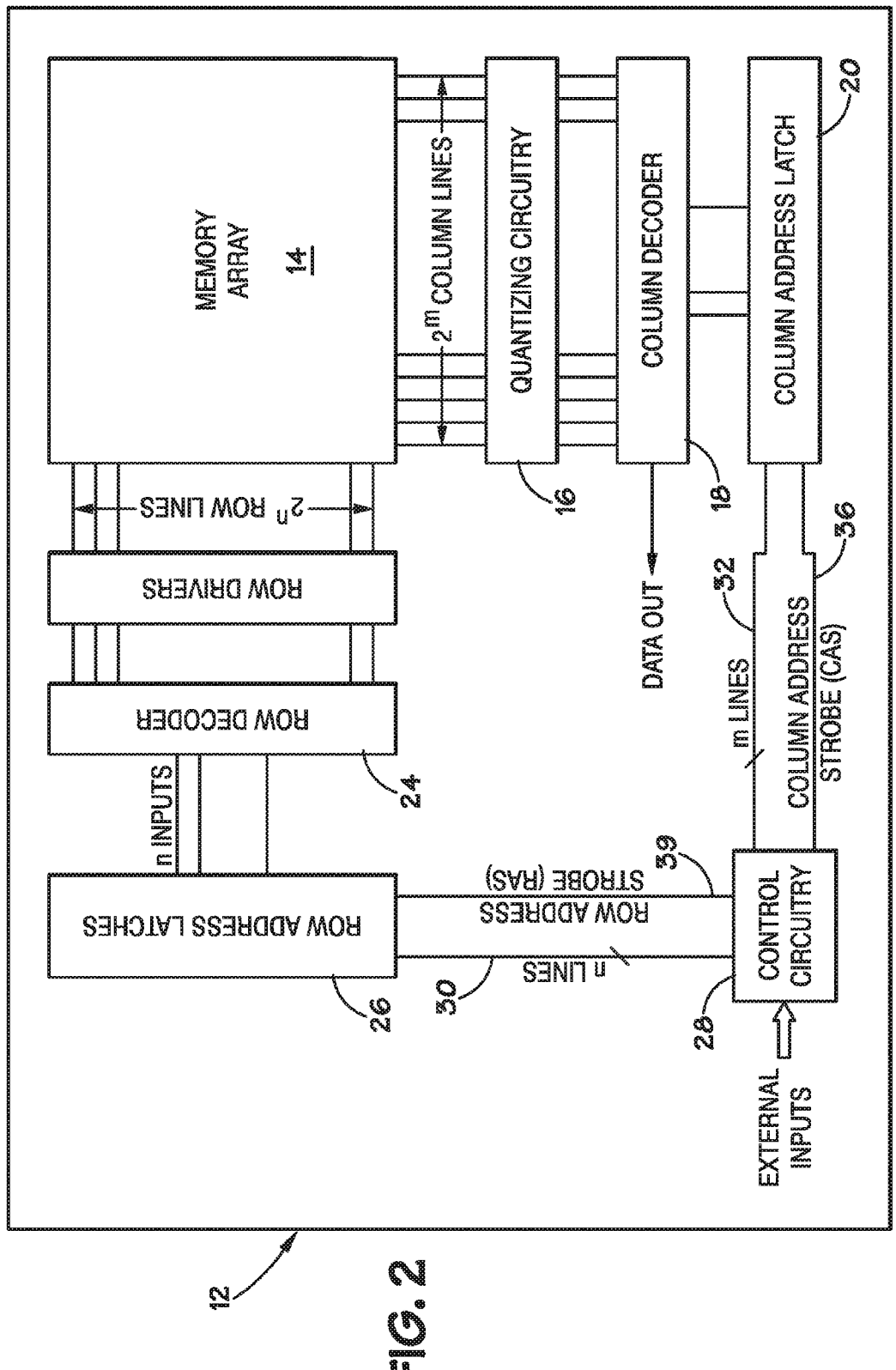
FIG. 2 illustrates a memory device in accordance with an embodiment of the present invention.

FIG. 2 depicts a block diagram of an embodiment of the memory device 12. The illustrated memory device 12 may include a memory array 14, a quantizing circuit 16, a column decoder 18, a column address latch 20, row drivers 22, a row decoder 24, row address latches 26, and control circuitry 28. As described below with reference to FIG. 3, the memory array 14 may include a matrix of memory elements arranged in rows and columns. As will be appreciated, the imaging device 13 (FIG. 1) may include similar features except that in the case of an imaging device 13, the array 14 might comprise an array of imaging elements, such as complementary-metal-oxide semiconductor (CMOS) imaging elements or charge coupled devices (CCDs).

When accessing the memory elements, the control circuitry may receive a command to read from or write to a target memory address. The control circuitry 28 may then convert the target address into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 34 (or other controlling clock signal) may be asserted by the control circuitry 28, and the row address latches 26 may latch the transmitted row address. Similarly, the control circuitry 28 may assert a column address strobe 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds with the latched column address, and the quantizing circuit 16 may quantize (e.g., sense) a voltage or current on the selected column. Additional details of reading and writing are described below.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are examples of electrical conductors. The memory array 14 further includes a plurality of memory elements 64, each of which may be arranged to intersect one of the bit-lines and one of the word-lines. In other embodiments, imaging elements may be disposed at each of these intersections.

The memory elements and imaging elements may be referred to generally as data locations, i.e., devices or elements configured to convey data, either stored or generated by a sensor, when sensed by a sensing circuit, such as the quantizing circuits discussed below. The data locations may be formed on an integrated semiconductor device (e.g., a device formed on a single crystal of silicon) that also includes the other components of the memory device 12 (or imaging device 13).

In some embodiments, the illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase change memory or magnetoresistive memory. In another example, the memory elements 64 may include a capacitor, such as a stacked or trench capacitor. Some types of memory elements 64 may include an access device, such as a transistor or a diode associated with each of the memory elements 64, or the memory elements 64 may not include an access device, for instance in a cross-point array.

Figure 4:
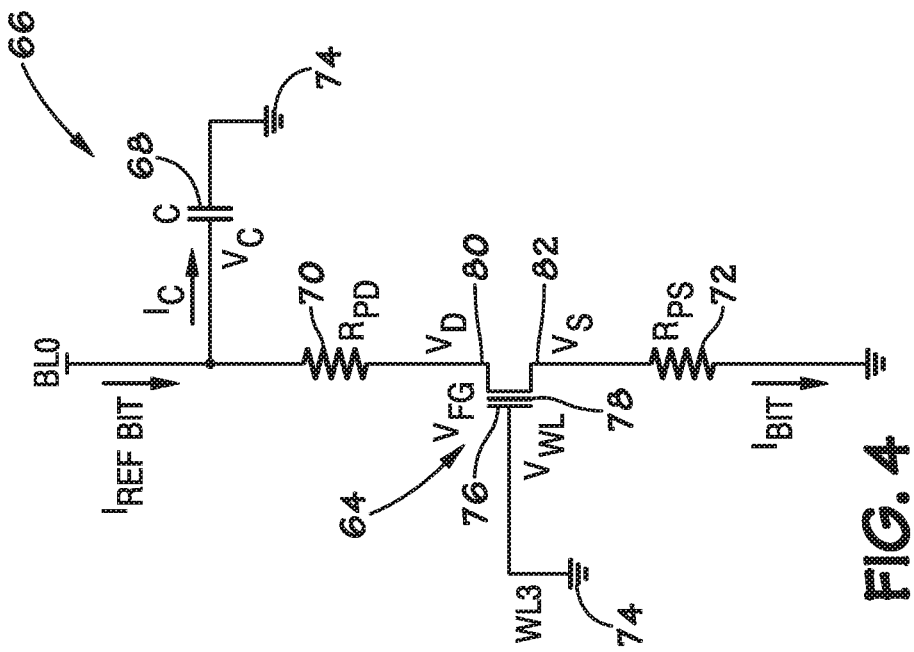
FIG. 4 illustrates a memory element in accordance with an embodiment of the present invention.

FIG. 4 illustrates a circuit 66 that models the operation of an arbitrarily selected memory element 64, which is disposed at the intersection of WL3 and BL0. This circuit 66 includes a capacitor 68, a pre-drain resistor 70 ($R_{PD}$), a post-source resistor 72 ($R_{PS}$), and a ground 74. The resistors 70 and 72 model the other devices in series with the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is connected to WL3. The pre-drain resistor 70, the drain 80, the source 82, and the post-source resistor 72 are disposed in series on the bit-line BL0. The capacitor 68, which models the capacitance of the bit-line, has one plate connected to ground 74 and another plate connected to the bit-line BL0, in parallel with the memory elements 64.

Several of the components of the circuit 66 represent phenomenon affecting the memory elements 64 when it is sensed. The pre-drain resistor 70 generally represents the drain-to-bitline resistance of the memory elements 64 connected to the bit-line above (i.e., up current from) WL3 when these memory elements 64 are turned on, (e.g., during a read operation). Similarly, the post source resistor 72 generally corresponds to the source-to-ground resistance of the memory elements 64 connected to the bit-line below WL3 when the memory element 64 is sensed. The circuit 66 models electrical phenomena associated with reading the memory elements 64 at the intersection of WL3 and BL0.

The operation of the memory elements 64 will now be briefly described with reference to FIGS. 4 and 5. FIG. 5 illustrates one potential relationship between the bit-line current ($I_{BIT}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store data by exploiting this effect.

To write data to the memory elements 64, a charge corresponding to the data may be stored on the floating gate 78. The charge of the floating gate 78 may be modified by applying voltages to the source 82, drain 80, and/or gate 76 such that the resulting electric fields produce phenomenon like Fowler-Northam tunneling and/or hot-electron injection near the floating gate 78. Initially, the memory elements 64 may be erased by applying a word-line voltage designed to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and quantizing (e.g., categorizing) a resulting bit-line current, $I_{BIT}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of 1x representing a binary data value of 001, and so on through $V_{FG}$ of 7x, which represents a binary data value of 111. Thus, by applying a voltage to the gate 76 and measuring the resulting bit-line current, the charge stored on the floating gate 78 may be sensed, and the stored data may be read.

The accuracy with which the bit-line current is quantized may affect the amount of data that a designer attempts to store in each memory element 64. For example, in a system with a low sensitivity, a single bit may be stored on each memory element 64. In such a system, a floating gate voltage $V_{FG}$ of 0x may represent a binary value of 0, and a floating gate voltage $V_{FG}$ of −7x may represent a binary value of one. Thus, the difference in floating gate voltages $V_{FG}$ corresponding to different data values may be relatively large, and the resulting differences and bit-line currents for different data values may also be relatively large. As a result, even low-sensitivity sensing circuitry may quantize (e.g., discern) these large differences in bit-line current during a read operation. In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may represent a different three-bit value: 000, 001, 010, 011, 100, 101, 110, or 111. Thus, circuitry that precisely quantizes the bit-line current $I_{BIT}$ may allow a designer to increase the amount of data stored in each memory element 64.

Figure 6:
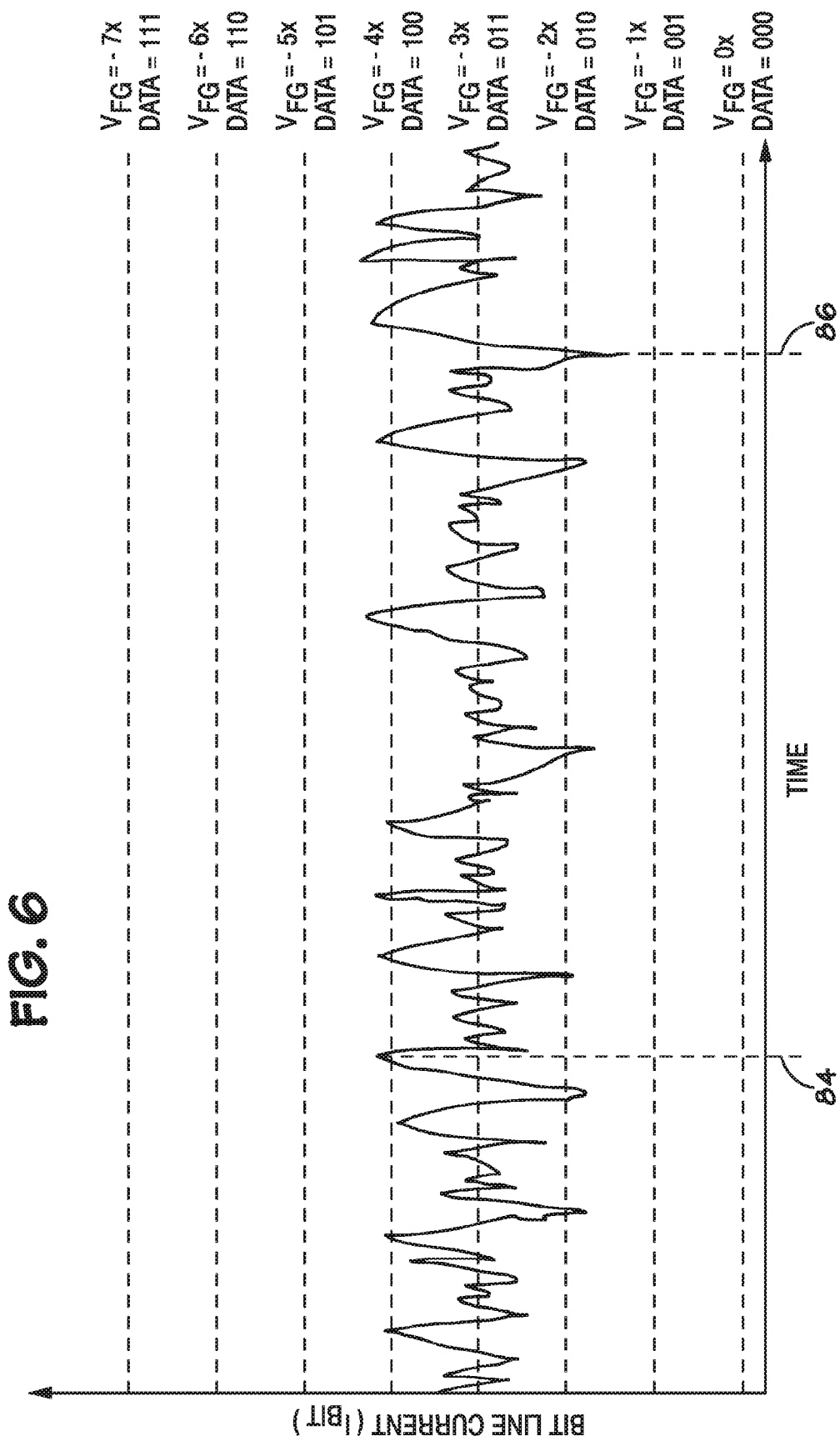
FIG. 6 illustrates noise in the bit-line current during a read operation.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$ and the bit-line current $I_{BIT}$. To illustrate these effects, FIG. 6 depicts noise on the bit-line while reading from the memory element 64. As illustrated, noise in the bit-line current $I_{BIT}$ may cause the bit-line current $I_{BIT}$ to fluctuate. Occasionally, the fluctuation may be large enough to cause the bit-line current $I_{BIT}$ to reach a level that represents a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise on the bit-line may cause erroneous readings from memory elements 64.

Figure 7:
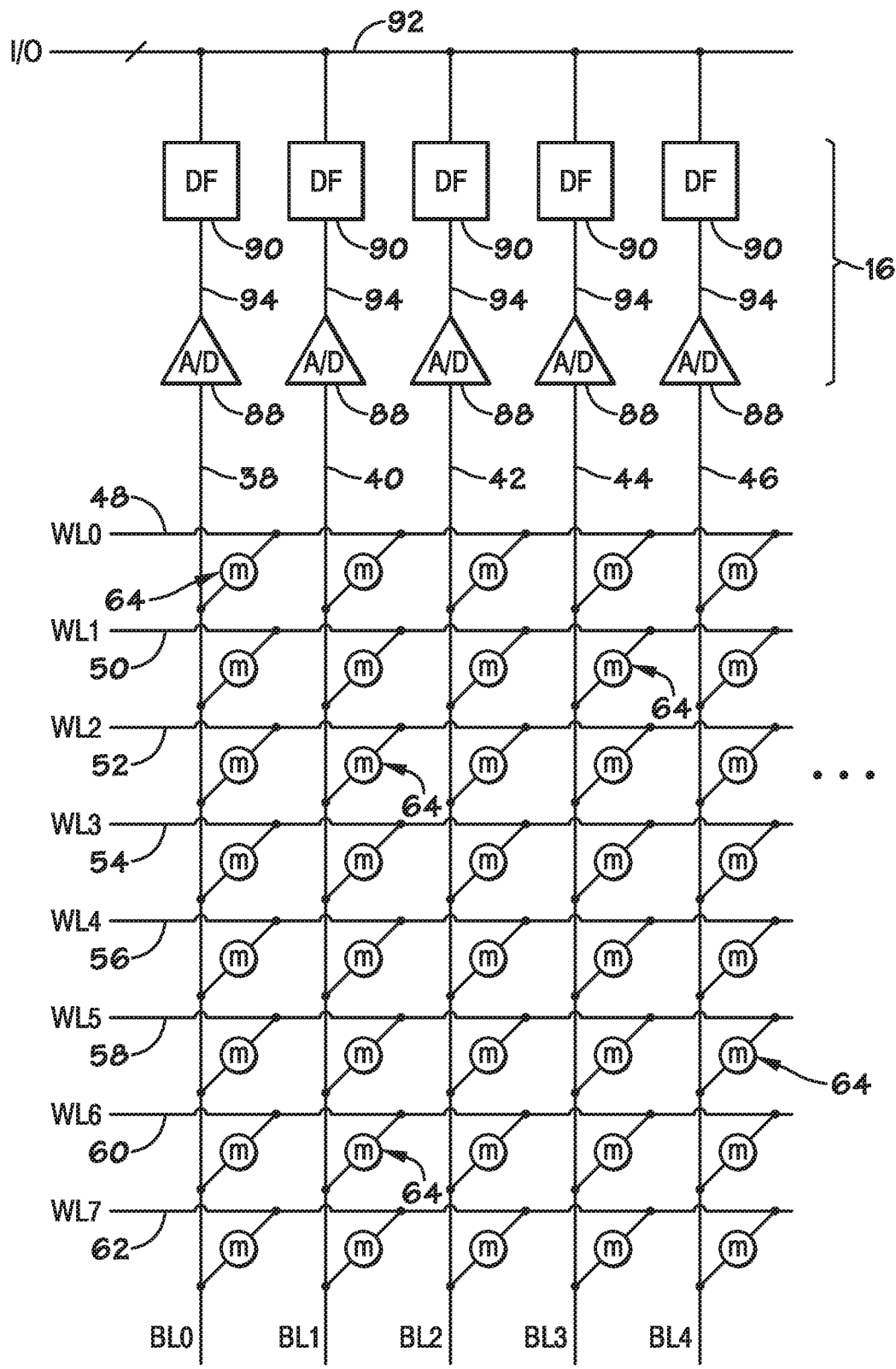
FIG. 7 illustrates a quantizing circuit in accordance with an embodiment of the present invention.

FIG. 7 depicts a quantizing circuit 16 that may tend to reduce the likelihood of an erroneous reading. The illustrated quantizing circuit 16 includes an analog-to-digital converter 88 and a digital filter 90 connected to each of the bit-lines 38, 40, 42, 44, and 46, respectively. Each bit-line 38, 40, 42, 44, and 46 may connect to a different analog-to-digital converter 88 and digital filter 90. The digital filters 90, in turn, may connect to an input/output bus 92, which may connect to a column decoder 18, a column address latch 20, and/or control circuitry 28 (see FIG. 2).

In operation, the quantizing circuit 16 may quantize (e.g., digitize) analog signals from the memory elements 64 in a manner that is relatively robust to noise. As explained below, the quantizing circuit 16 may do this by converting the analog signals into a bit-stream and digitally filtering high-frequency components from the bit-stream.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{BIT}$ or a bit-line voltage $V_{BL}$, and outputs a bit-stream that represents the analog signal. The bit-stream may be a one-bit, serial signal with a time-averaged value that generally represents the time-averaged value of the analog signal from the memory element 64. That is, the bit-stream may fluctuate between values of zero and one, but its average value, over a sufficiently large period of time, may be proportional to the average value of the analog signal from the memory element 64. In certain embodiments, the bit-stream from the analog-to-digital converter 88 may be a pulse-density modulated (PDM) version of the analog signal. The analog-to-digital converter 88 may transmit the bit-stream to the digital filter 90 on a bit-stream signal path 94.

The digital filter 90 may digitally filter high-frequency noise from the bit-stream. To this end, the digital filter 90 may be a low-pass filter, such as a counter, configured to average (e.g., integrate and divide by the sensing time) the bit-stream over a sensing time, i.e., the time period over which the memory element 64 is read. (Alternatively, in some embodiments, the digital filter 90 is configured to integrate the bit-stream without dividing by the sensing time.) As a result, the digital filter 90 may output a value that is representative of both the average value of the bit-stream and the average value of the analog signal from the memory element 64. In some embodiments, the digital filter 90 is a counter, and the cut-off frequency of the digital filter 90 may be selected by adjusting the duration of the sensing time. In the present embodiment, increasing the sensing time will lower the cutoff frequency. That is, the frequency response of the digital filter 90 may be modified by adjusting the period of time over which the bit-stream is integrated and/or averaged before outputting a final value. The frequency response of the digital filter 90 is described further below with reference to FIG. 15. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different data values may be made smaller, and the number of data values stored by a given memory element 64 may be increased. Thus, beneficially, the quantizing circuit 16 may read memory elements 64 that store several bits of data, e.g., 2, 3, 4, 5, 6, 7, 8, or more bits per memory element 64.

Although the quantizing circuit 16 may sense the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
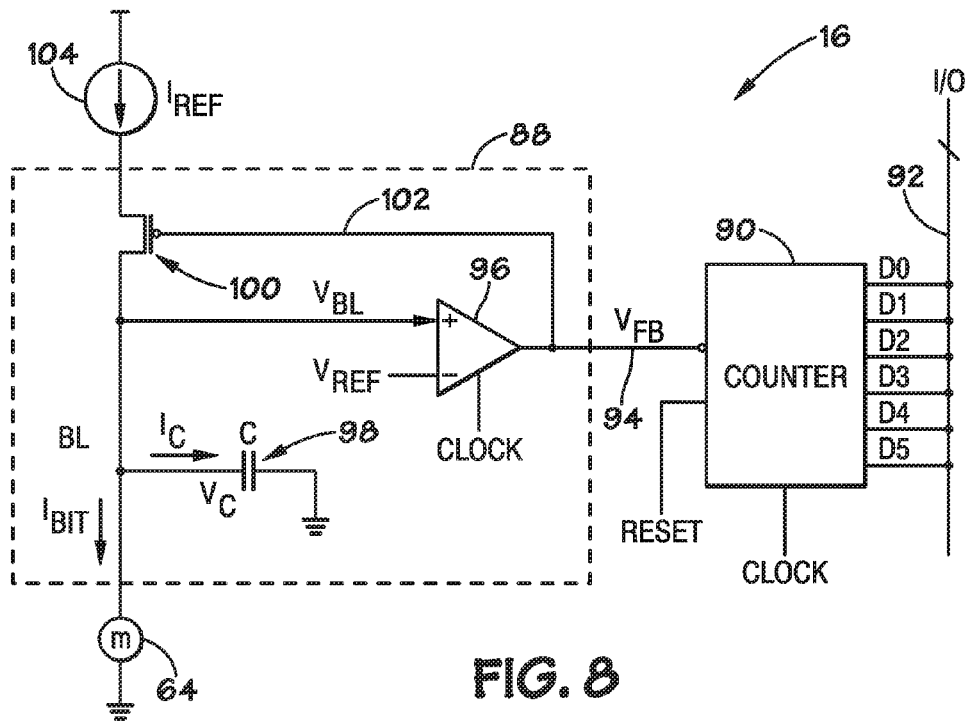
FIG. 8 illustrates a delta-sigma sensing circuit in accordance with an embodiment of the present invention.

FIG. 8 illustrates details of one implementation of the quantizing circuit 16. In this embodiment, the digital filter 90 is a counter, and the analog-to-digital converter 88 is a first-order delta-sigma modulator. The illustrated delta-sigma modulator 88 may include a latched comparator 96, a capacitor 98, and a switch 100. In other embodiments, other types of digital filters and analog-to-digital converters may be employed, such as those described below in reference to FIGS. 17 and 18.

As illustrated, an input of the counter 90 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{REF}$). One plate of the capacitor 98 may connect to one of the bit-lines 38, 40, 42, 44, or 46, and the other plate of the capacitor 98 may connect to ground.

The illustrated counter 90 counts the number of clock cycles that the bit-stream 94 is at a logic high value or logic low value during the sensing time. The counter may count up or count down, depending on the embodiment. In some embodiments, the counter 90 may do both, counting up one for each clock cycle that the bit-stream has a logic high value and down one for each clock cycle that the bit-stream has a logic low value. Output terminals (D0-D5) of the counter 90 may connect to the input/output bus 92 for transmitting the count. The counter 90 may be configured to be reset to zero or some other value when a reset signal is asserted. In some embodiments, the counter 90 may be a series connection of D-flip flops, e.g., D-flip flops having SRAM or other memory for storing an initial value and/or values to be written to the memory element 64.

In the illustrated embodiment, the clocked comparator 96 compares a reference voltage ($V_{REF}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{REF}$, then the comparator 96 may latch its output to a logic low value, as described below in reference to FIG. 9. Conversely, if $V_{BL}$ is greater than $V_{REF}$, then the comparator 96 may latch a logic high value on its output, as described below in reference to FIG. 10. As a result, the illustrated comparator 96 outputs a bit-stream that indicates whether $V_{BL}$ is larger than $V_{REF}$, where the indication is updated once per clock cycle.

Advantageously, in some embodiments, the quantizing circuit 16 may include a single comparator (e.g., not more than one) for each column of multi-level memory elements 64. In contrast, conventional sense amplifiers often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
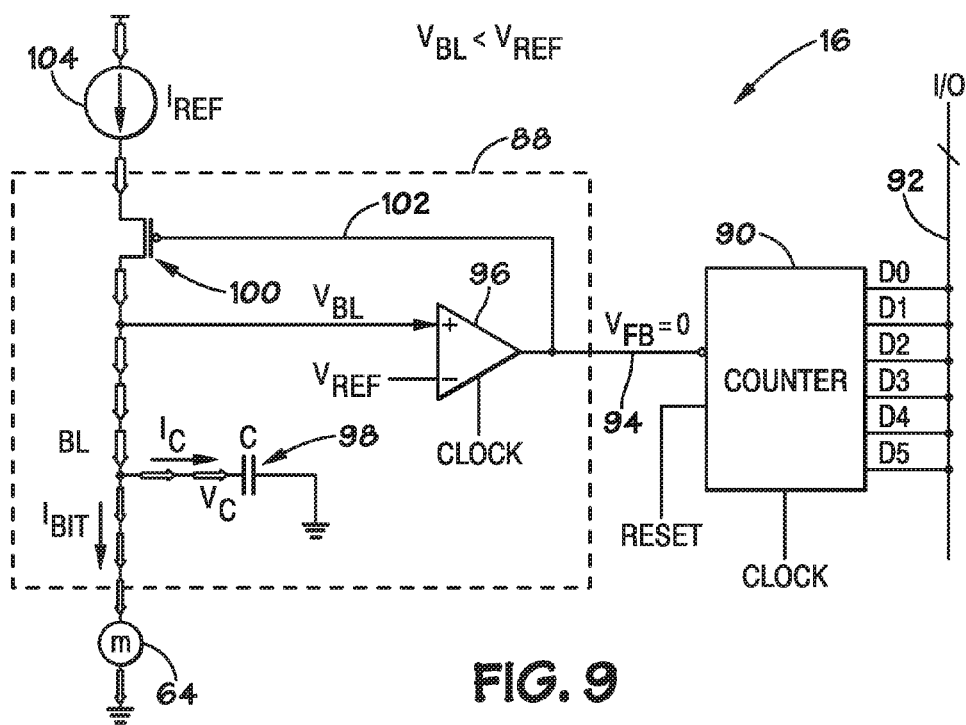
FIGS. 9 and 10 illustrate current flow during operation of the quantizing circuit of FIG. 8.
Figure 10:
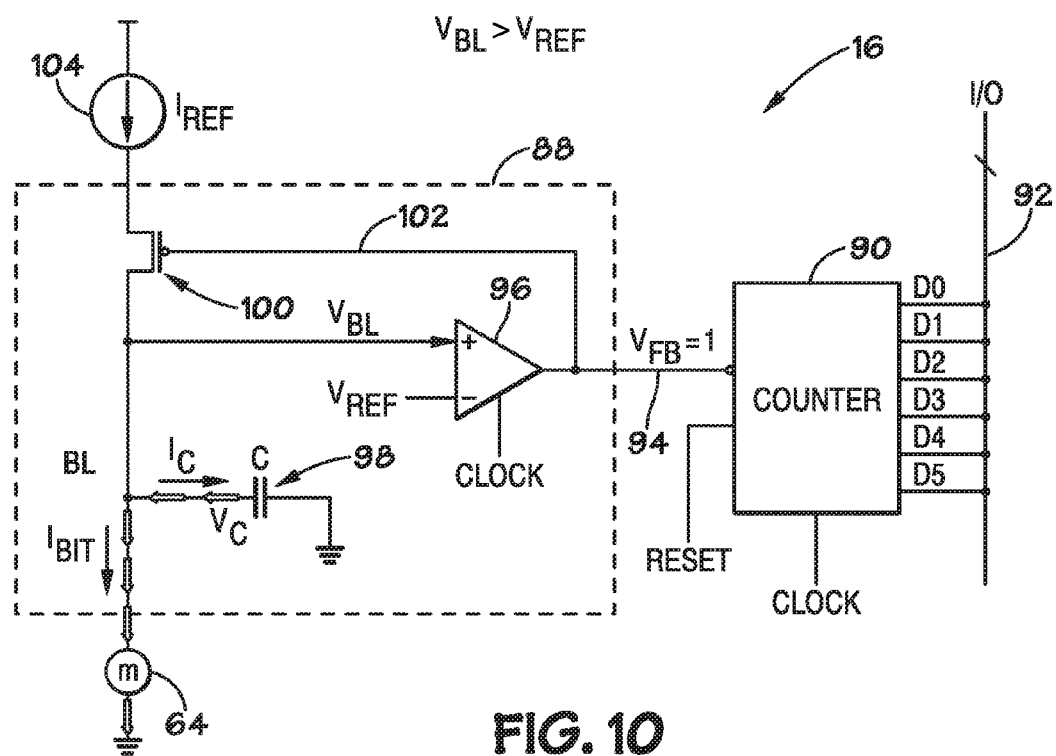
Figure 17:
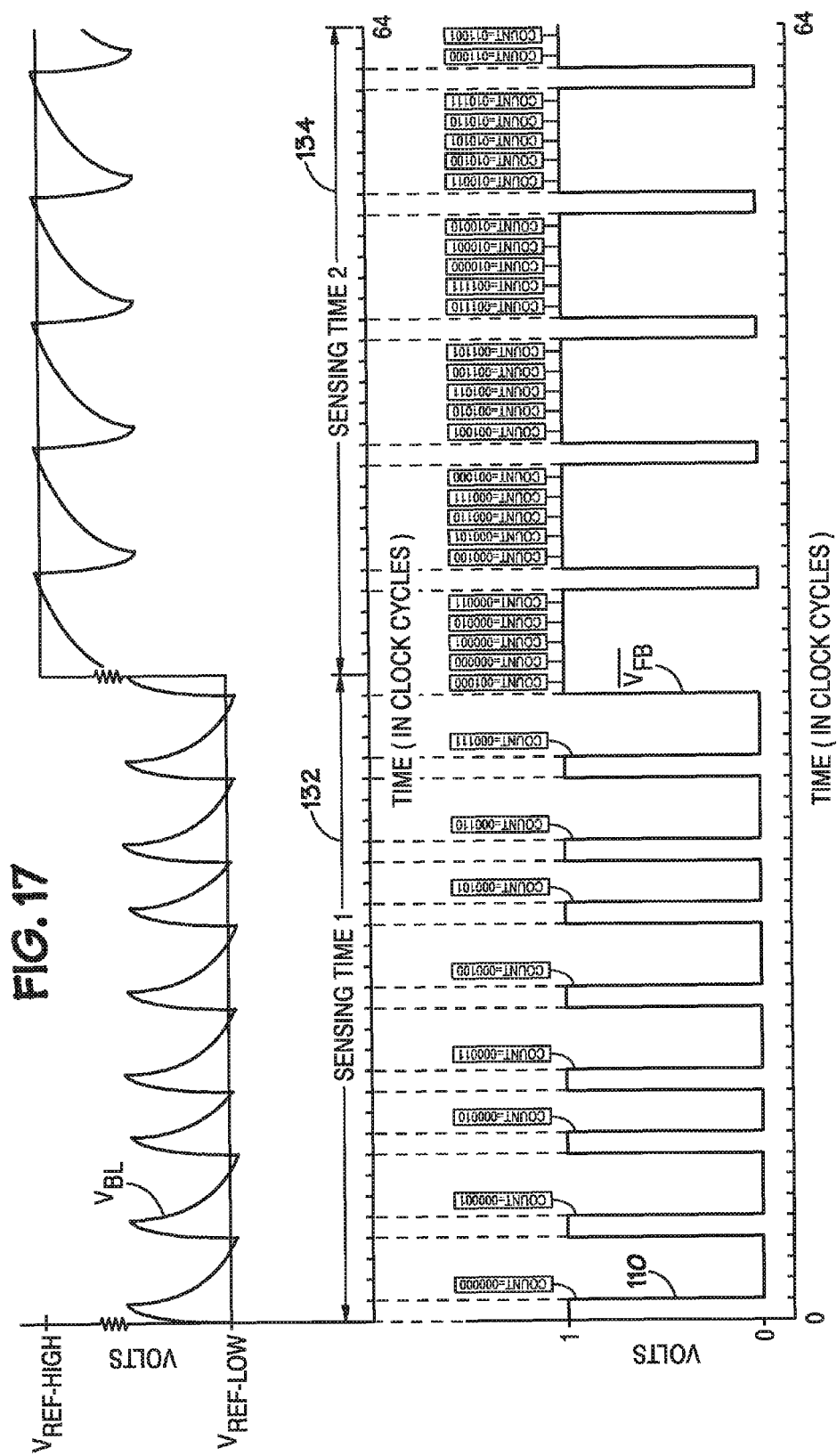
FIG. 17 illustrates voltages in the delta-sigma modulator of FIG. 16.

The illustrated switch 100 selectively transmits current $I_{REF}$ from the reference current source 104. In various embodiments, the switch 100 may be a PMOS transistor (as illustrated in FIGS. 8-10) or an NMOS transistor (as illustrated in FIG. 17) controlled by the $V_{FB}$ signal on the feedback signal path 102.

Figure 11:
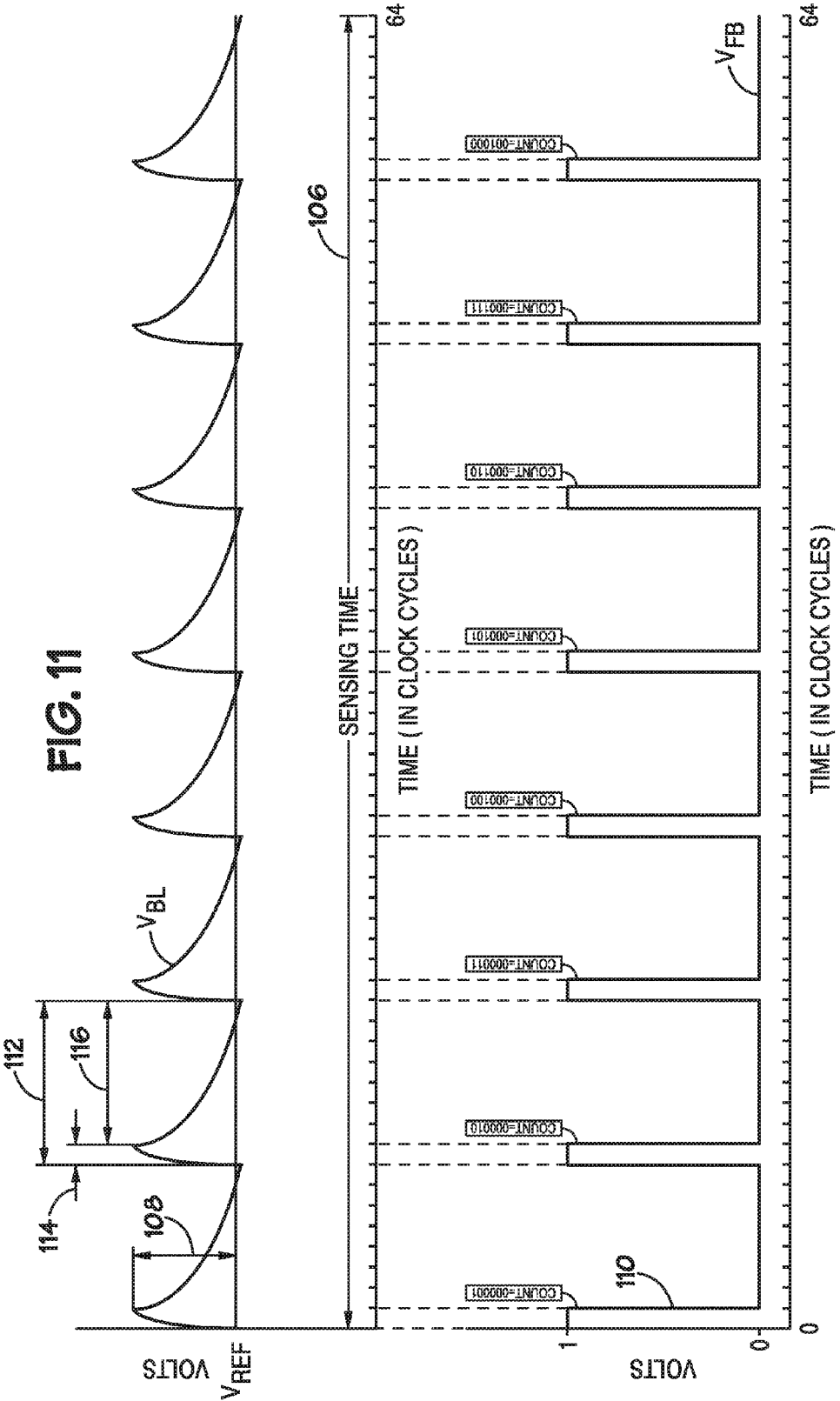
FIGS. 11-13 illustrate voltages in the quantizing circuit of FIG. 8 when sensing small, medium, and large currents, respectively.
Figure 12:
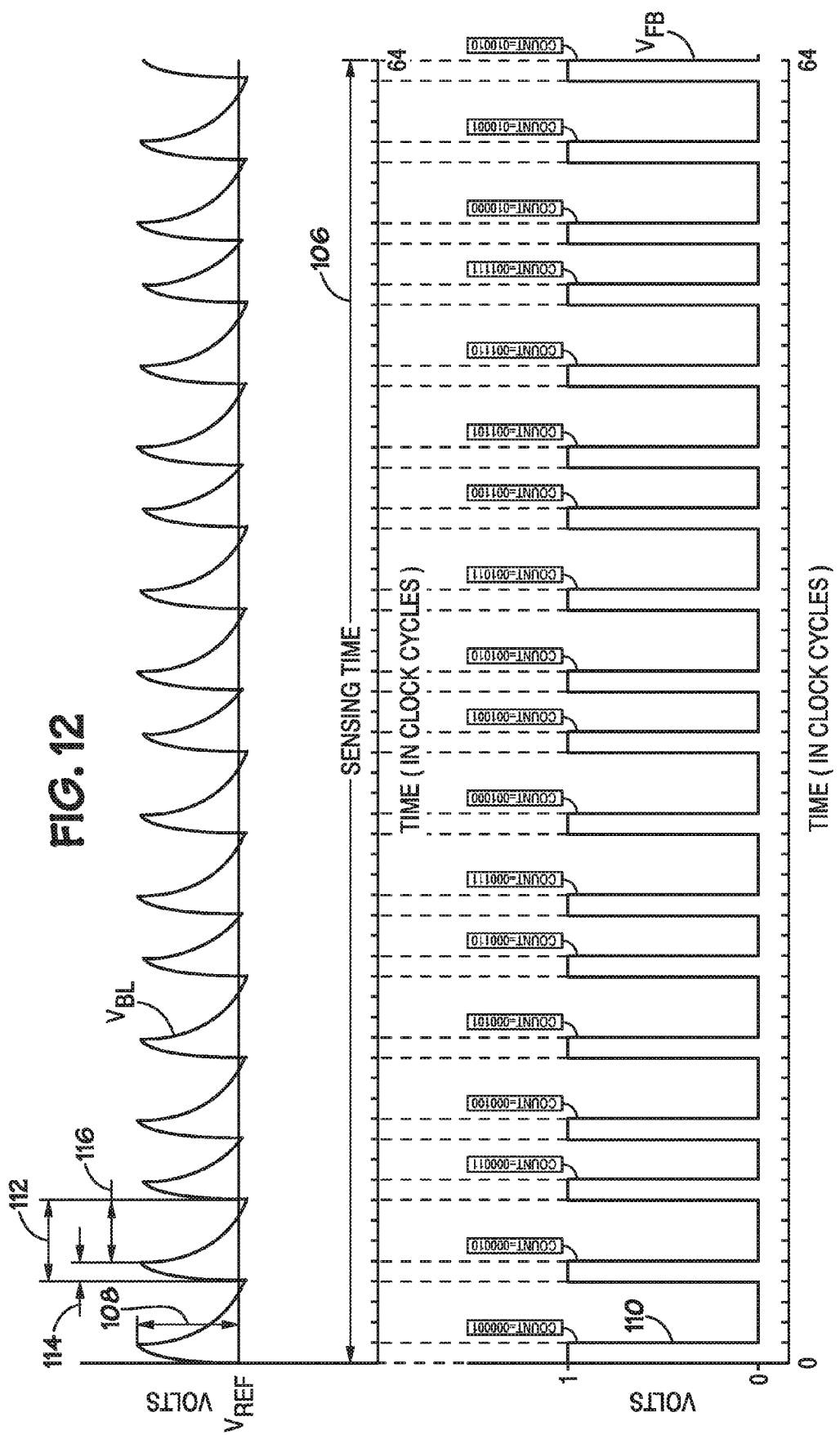
Figure 13:
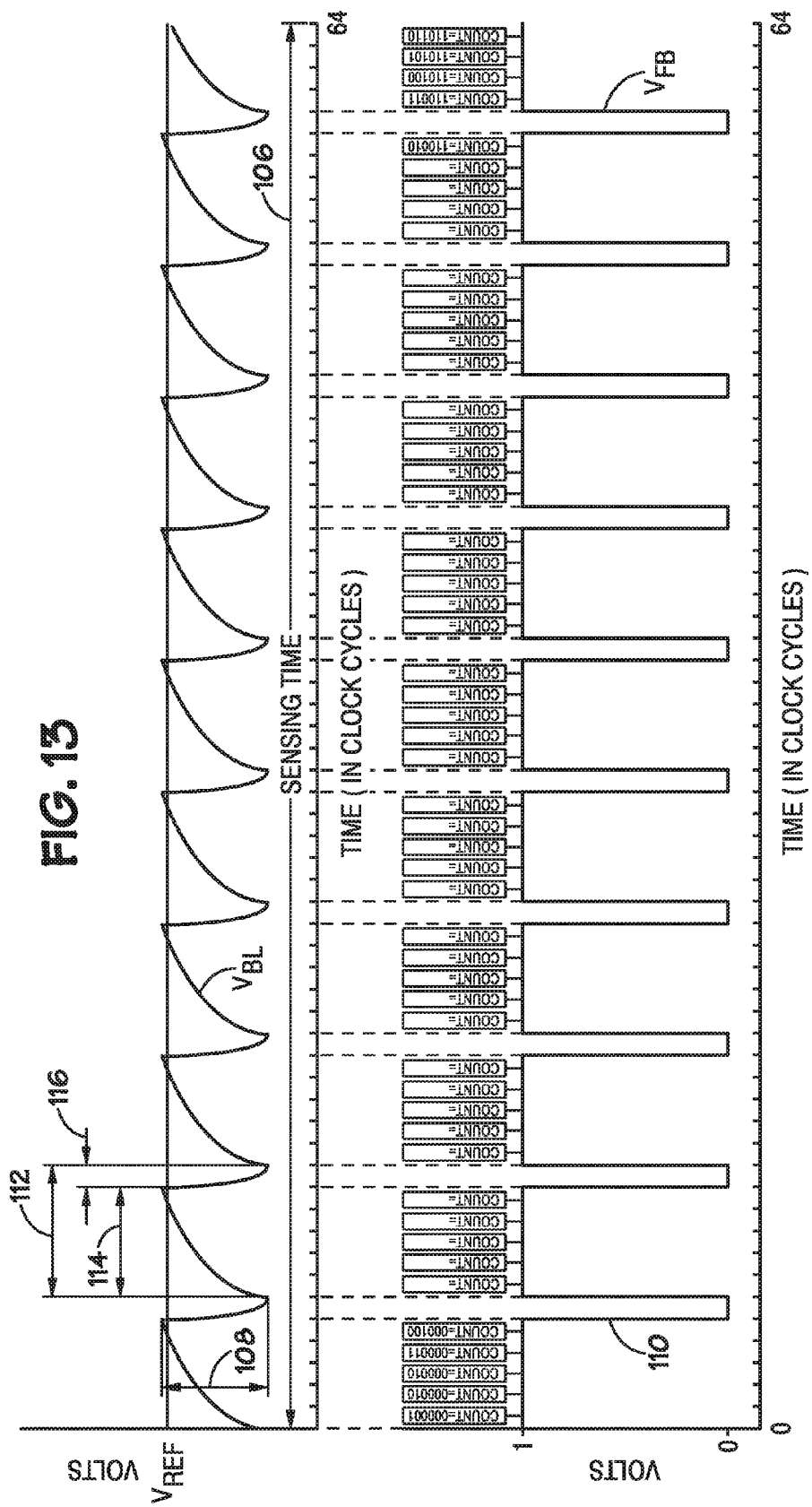

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count of the counter 90 for a relatively small bit-line current. FIG. 12 depicts the same voltages when measuring a medium sized bit-line current, and FIG. 13 depicts these voltages when measuring a relatively large bit-line current.

To sense the current through the memory element 64, the illustrated delta-sigma modulator 88 exploits transient effects to output a bit-stream representative of the bit-line current $I_{BIT}$. Specifically, the delta-sigma modulator 88 may repeatedly charge and discharge the capacitor 98 with a current divider that subtracts the bit-line current $I_{BIT}$ from the reference current $I_{REF}$. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state"). Each time the delta-sigma modulator 88 transitions between these states, the bit-stream changes from a logic high value to a logic low value or vice versa. The proportion of time that the delta-sigma modulator 88 is in the state illustrated by either FIG. 9 or FIG. 10 may be proportional to the size of the bit-line current $I_{BIT}$ through the memory element 64. The larger the bit-line current $I_{BIT}$, the more time that the delta-sigma modulator 88 is in the state illustrated by FIG. 9, rather than the state illustrated by FIG. 10, and the more time that the bit-stream has a logic low value.

Starting with the charging state (FIG. 9), the capacitor 98 may initially accumulate a charge (e.g., become more charged). To this end, the output of the comparator 96 is latched to logic low, which, as mentioned above, may occur when $V_{BL}$ is less than $V_{REF}$. The logic low may be conveyed to switch 100 by the feedback signal path 102, and the switch 100 may close, thereby conducting the reference current $I_{REF}$ through one of the bit-lines 38, 40, 42, 44, or 46, as indicated by the larger arrows in FIG. 9. A portion of the electrons flowing through the reference current source 104 may be accumulated by the capacitor 98, as indicated by the smaller-horizontal arrows, and the remainder may be conducted through the memory element 64, i.e., the bit-line current $I_{BIT}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 transitions to the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{REF}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{REF}$. Once per clock cycle (or at some other appropriate interval, such as twice per clock cycle), the comparator 96 may compare the voltage of the capacitor $V_{BL}$ to the reference voltage $V_{REF}$. If the capacitor 98 has been charged to the point that $V_{BL}$ is greater than $V_{REF}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease conducting current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{REF}$. If $V_{BL}$ is still greater than $V_{REF}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{REF}$, then the comparator 96 may output a logic low signal, i.e., $V_{FB}=0$, and the switch 100 may close, thereby transitioning the delta-sigma modulator 88 back to the charging state and initiating a new cycle.

The counter 90 may count the number of clock cycles that the delta-sigma modulator 88 is in either the charging state or the discharging state by monitoring the bit-stream signal path 94. The bit-stream signal path 94 may transition back and forth between logic high and logic low with the output of the comparator 96, $V_{FB}$, and the counter 90 may increment and/or decrement a count once per clock cycle (or other appropriate interval) based on whether the bit-stream is logic high or logic low. After the sensing time has passed, the counter 90 may output a signal indicative of the count on output terminals D0-D5. As explained below, the count may correspond, e.g., proportionally, to the bit-line current, $I_{BIT}$.

FIGS. 11-13 illustrate voltages $V_{FB}$ and $V_{BL}$ in the quantizing circuit 16 when reading data from a memory element 64. Specifically, FIG. 11 illustrates a low-current case, in which the value stored by the memory element 64 is represented by a relatively low bit-line current. Similarly, FIG. 12 illustrates a medium-current case, and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $V_{BL}$. The abscissa in each of the traces represents time, with the lower trace synchronized with the upper trace, and the duration of the time axes is one sensing time 106.

As illustrated by FIG. 11, the counter 90 is initially preset to zero (or some other appropriate value) by applying a reset signal. In some embodiments, the delta-sigma modulator 88 may undergo a number of start-up cycles to reach steady-state operation before initiating the sensing time and resetting the counter 90. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 90 increments the count by one to account for one clock cycle of the bit-stream signal 94 holding a logic low value. Next, the charge stored on the capacitor 98 drains out through the memory element 64, and the bit-line voltage drops until the comparator 96 determines that $V_{BL}$ is less than $V_{REF}$, at which point the cycle repeats. The cycle has a period 112, which may be divided into a charging portion 114 and a discharging portion 116. Once during each cycle in the sensing time 106, the count stored in the counter 90 may increase by one. At the end of the sensing time 106, the counter 90 may output the total count.

A comparison of FIG. 11 to FIGS. 12 and 13 illustrates why the count correlates with the bit-line current. In FIG. 13, the high-current case, the stored charge drains from the capacitor 98 quickly, relative to the other cases, because the bit-line current $I_{BIT}$ is large and, as a result, the delta-sigma modulator 88 spends more time in the charging state than the discharging state. As a result, the bit-stream has a logic low value for a large portion of the sensing time 106, thereby increasing the count.

The capacitance of the capacitor 98 may be selected with both the clock frequency and the range of expected bit-line currents in mind. For example, the capacitor 98 may be large enough that the capacitor 98 does not fully discharge (e.g., saturate) when the bit-line current $I_{BIT}$ is either at its lowest expected value or at its highest expected value. That is, in some embodiments, the capacitor 98 generally remains in a transient state while reading the memory element 64. Similarly, the frequency at which the comparator 96 is clocked may affect the design of the capacitor 98. A relatively high frequency clock signal may leave the capacitor 98 with relatively little time to discharge or saturate between clock cycles, thereby leading a designer to choose a smaller capacitor 98.

Similarly, the size of the reference current may be selected with the range of expected bit-line currents in mind. Specifically, in certain embodiments, the reference current is less than the largest expected bit-line current $I_{BIT}$, so that, in the case of maximum bit-line current $I_{BIT}$, the capacitor 98 can draw charge from the reference current while the rest of the reference current flows through the memory element 64.

Figure 14:
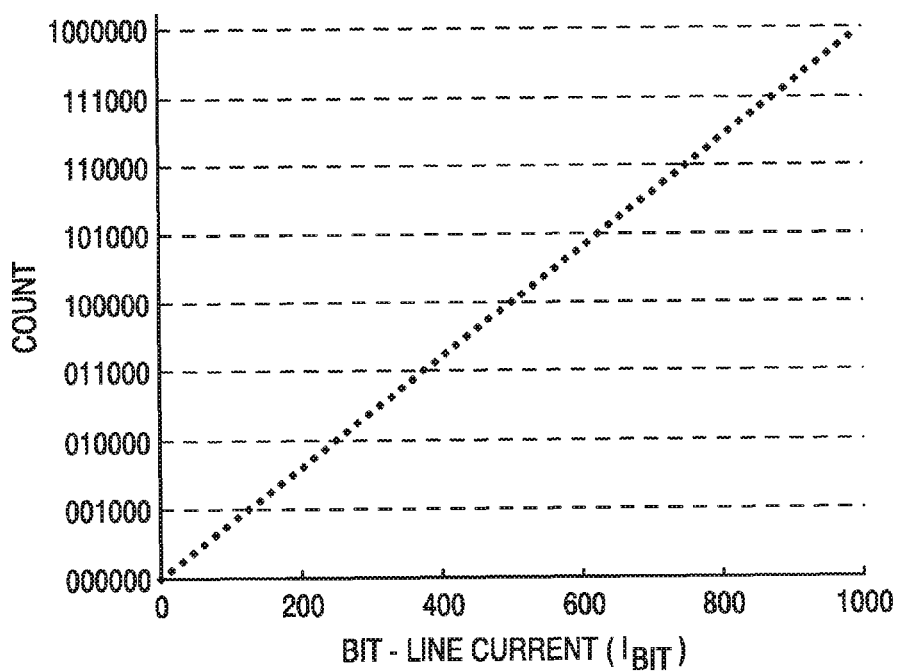
FIG. 14 is a graph of bit-line current versus counter output for the quantizing circuit of FIG. 8.

FIG. 14 illustrates the relationship between the bit-line current $I_{BIT}$ and the count for the presently discussed embodiment. As illustrated by FIG. 14, the count corresponds with (e.g., is generally proportional to) the bit-line current $I_{BIT}$. This relationship is described by the following equation (Equation 1), in which $N_{ST}$ represents the number of clock cycles during the sensing time:

$$I_{BIT}/I_{REF}=\text{Count}/N_{ST}$$

Thus, in the illustrated embodiment, the count corresponds with (e.g., is indicative of) the bit-line current $I_{BIT}$, which corresponds with the value stored by the memory element 64.

Advantageously, the quantizing circuit 16 may quantize (e.g., categorize) the bit-line current $I_{BIT}$ as falling into one of a large number of categories, each of which is represented by an increment of the count. In doing so, in some embodiments, the quantizing circuit 16 may resolve small differences in the bit-line current $I_{BIT}$. The resolution of the quantizing circuit 16 may be characterized by the following equation (Equation 2), in which $I_{MR}$ represents the smallest resolvable difference in bit-line current $I_{BIT}$, i.e., the resolution of the quantizing circuit 16:

$$I_{MR}=I_{REF}/N_{ST}$$

Thus, the resolution of the quantizing circuit 16 may be increased by increasing the sensing time or the clock frequency or by decreasing $I_{REF}$, which may limit the maximum cell current since $I_{MR}$ is less than $I_{REF}$.

The resolution of the quantizing circuit 16 may facilitate storing multiple bits in the memory element 64 or sensing multiple levels of light intensity in an image sensor element. For example, if the quantizing circuit 16 is configured to quantize (e.g., categorize) the bit-line current $I_{BIT}$ into one of four different levels, then the memory element 64 may store two-bits of data or, if the quantizing circuit 16 is configured to categorize the bit-line current $I_{BIT}$ into one of eight different current levels, then the memory element 64 may store three-bits of data. For the present embodiment, the number of bits stored by the memory element 64 may be characterized by the following equation (Equation 3), in which $N_B$ represents the number of bits stored by a memory element 64 and $I_{RANGE}$ represents the range of programmable bit-line currents through the memory element 64:

$$N_B=\log(I_{RANGE}/I_{MR})/\log 2$$

In short, in the present embodiment, greater resolution translates into higher density data storage for a given memory element 64.

Figure 15:
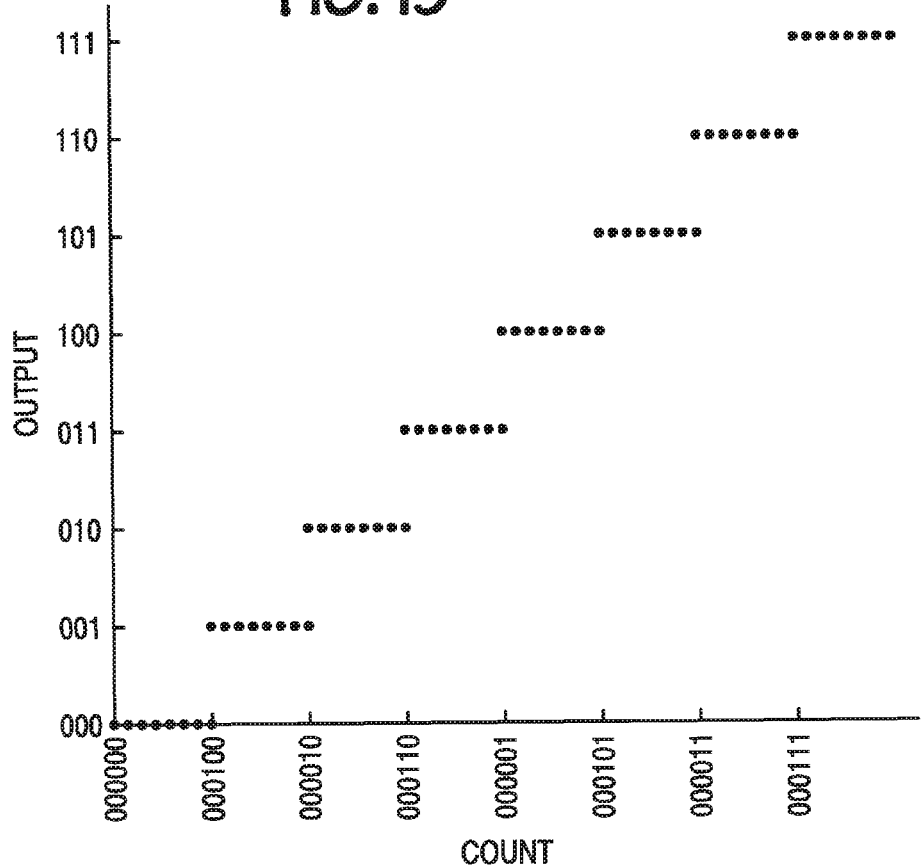
FIG. 15 is a graph of count versus quantizing circuit output in accordance with an embodiment of the present invention.

FIG. 15 is a graph that illustrates one way in which the counter 90 may be configured to further reduce the effects of noise. In FIG. 15, the abscissa represents the count, and the ordinate represents the output of the quantizing circuit 16. In the present embodiment, the three-least-significant digits of the count are disregarded as potentially corrupted by noise. That is, D0-D2 (FIG. 8) either do not connect to the input/output bus 92 or are not interpreted as conveying data that is stored by the memory element 64. As a result, a range of counter values may represent a single data value stored by the memory element 64. For example, in the present embodiment, count values ranging from 00 1000 to 00 1111 are construed as representing a data value of 001. Representing data in this manner may further reduce the effects of noise because, even if noise affects the count, in many embodiments, it would have to affect the count in a consistent manner over a substantial portion of the sensing time to affect the more significant digits of the count. That is, disregarding less significant digits may lower the cutoff frequency of the counter 90. In other embodiments, fewer, more, or no digits may be truncated from the count as potentially representing noise.

Truncating less significant digits may introduce a rounding error, or a downward bias, in the output. This effect may be mitigated by presetting (e.g., driving latches to a particular state in advance of counting or storing a value in memory) the counter 90 in a manner that accounts for this bias. The counter 90 may be preset either before reading from the memory element 64 or before writing to the memory element 64. In some embodiments, the preset value may be one-half of the size of the range of counter values that represent a single output value. In other words, if m digits are truncated from the output, then the counter 90 may be preset to one-half of $2^m$ before reading from a memory element 64 or before writing to the memory element 64. In some embodiments, the memory in the counter 90 may store this preset value.

In some of the previously described embodiments, the reference voltage $V_{REF}$ is generally constant while sensing the data location 64. This is not necessarily the case in the embodiment of FIG. 16, which illustrates an example of a quantizing circuit 120 with a varying reference voltage $V_{REF}$. Quantizing circuit 120 may read data by sensing the data location 64 under changing conditions, e.g., different bit-line voltages $V_{BL}$, which may be altered by changing the reference voltage $V_{REF}$. As described below, the response of the data location 64 to each condition, as well as the change in its response to each change in conditions, may convey information about stored data. Further, this information may be aggregated to improve the precision with which the quantizing circuit 120 writes to, and reads from, the data location 64. Such advantages are described further below, after the components and operation of the quantizing circuit 120 are described.

The illustrated quantizing circuit 120 includes the features of the previously described quantizing circuit 16 (FIG. 8) along with some additional components. Among the additional components are a controller 122 and an interfuser 124, e.g., a component configured to identify a quantity (e.g., a charge on a floating gate) based on multiple measurements indicative of that quantity. Specific examples of how the interfuser 124 may combine measurements are described below.

These additional components 122 and 124 may communicate with other portions of the quantizing circuit 120. In the present embodiment, the controller 122 communicates with three other components: an inverting input of the comparator 96 via a reference signal path 126, an input of the counter 90 via a reset signal path 128, and an input of the interfuser 124 via a state signal path 130. The illustrated interfuser 124 may couple to both the counter 90 and the input/output bus 92 via a plurality of digit signal paths labeled D0-D5. Other embodiments may include more or fewer digit signal paths. In some embodiments, the number of digit signal paths coupling the interfuser to the counter may be different (i.e., less or more) than the number of digit signal paths coupling the interfuser 124 to the input/output bus 92.

Like some of the previously described embodiments, the components of the illustrated quantizing circuit 120 may be formed on an integrated semiconductor device. However, in some embodiments, one or more of the components of the illustrated quantizing circuit 120 may be disposed on another chip or device.

The illustrated controller 122 may be configured to coordinate the operation of the quantizing circuit 120. For example, the controller 122 may vary the reference voltage $V_{REF}$ applied to the inverting input of the comparator 96. In some embodiments, the controller 122 may vary $V_{REF}$ according to a process described below in reference to FIG. 19. When $V_{REF}$ changes, the controller 122 may also signal the interfuser 124 on the state signal path 130, thereby indicating that the quantizing circuit 120 is measuring the data location 64 under a different set of conditions. In certain embodiments, when sending the state change signal, the controller 122 may also transmit a reset signal to the counter 90, which may cause the counter 90 to shift its count to the interfuser 124 and reset the count. Specific sequences of these signals are described below.

Figure 18:
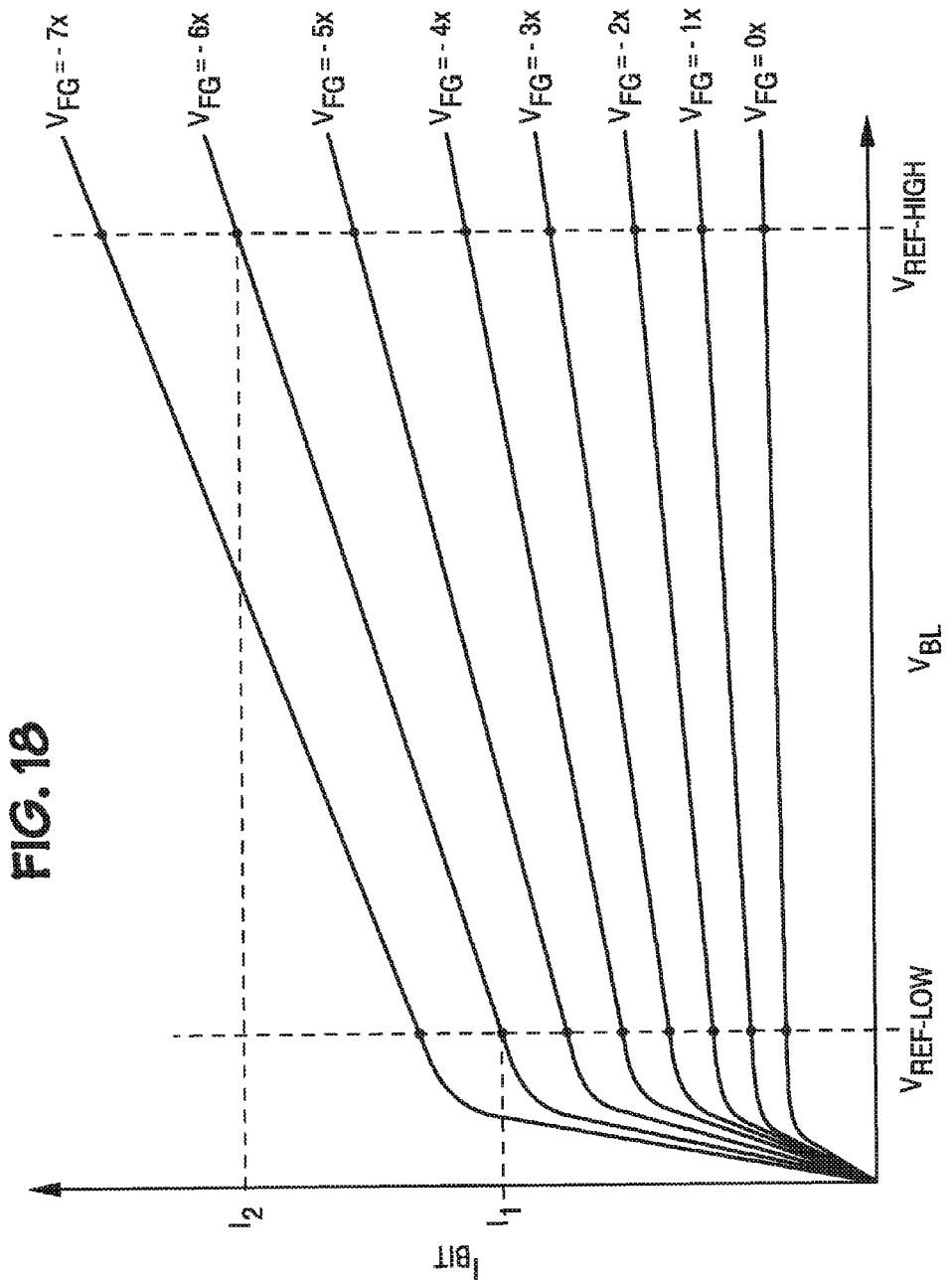
FIG. 18 illustrates I-V traces of memory elements storing different values in accordance with an embodiment of the present invention.

The operation of the quantizing circuit 120 will now be described with reference to the following figures: FIG. 17, which illustrates voltages in the quantizing circuit over time; FIG. 18, which illustrates the response of a floating gate transistor to different source-to-drain voltages and floating gate charges; and FIG. 19, which illustrates a process for using data from FIG. 17 to identify a floating gate charge in FIG. 18.

As noted, FIG. 17 illustrates voltages in the quantizing circuit 120 when reading data from the data location 64. Specifically, the top portion of FIG. 17 illustrates the bit-line voltage $V_{BL}$ over time, and the lower trace illustrates the complement of the feedback voltage $V_{FB}$ (i.e., the bit-stream) over time. In the figure, the illustrated time period is divided into two portions: a first sensing time 132 and a second sensing time 134. Between these two time periods 132 and 134, the reference voltage $V_{REF}$ changes from a low reference voltage to a high reference voltage. Within a time period 132 or 134, in this embodiment, the reference voltage is generally constant. The change in the reference voltage $V_{REF}$ may be larger than it appears in the figure. To depict variation in the bit-line voltage $V_{BL}$, the difference between $V_{REF-LOW}$ and $V_{REF-HIGH}$ is compressed.

With the exception of the change in reference voltage $V_{REF}$, the traces illustrated by FIG. 17 are similar to those discussed above with reference to FIGS. 11-13. As previously described, the delta-sigma modulator 88 (FIG. 16) may attempt to keep the bit-line voltage $V_{BL}$ above the reference voltage $V_{REF}$ by elevating the feedback voltage $V_{FB}$ whenever the bit-line voltage $V_{BL}$ is less than the reference voltage $V_{REF}$. As described, elevating the feedback voltage $V_{BL}$ (or its compliment, in some embodiments) turns on the current switch 100, and as a result, the reference current $I_{REF}$ flows into the bit-line, thereby elevating its voltage $V_{BL}$. Thus, the ratio of the sensing time that $V_{BL}$ is high is proportional to the current leaving the bit-line $I_{BIT}$ through the data location 64.

In this embodiment, when $V_{REF}$ increases, the set-point of the delta-sigma modulator 88 changes and $V_{BL}$ rises, thereby driving more current $I_{BIT}$ through the data location 64 to ground 74. As a result, in this embodiment, the count accumulates faster during the second sensing time 134 than during the first sensing time 132, because a higher $V_{REF}$ leads to a higher $V_{BL}$, which drives a larger bit-line current $I_{BIT}$ to ground 74. A larger $I_{BIT}$ may cause $V_{FB}$ to remain at logic high for more time to accommodate the larger bit-line current $I_{BIT}$, and the count may accumulate faster.

The change that results from changing $V_{REF}$ may depend on the type of data location and its state. An example of the relationship between bit-line current $I_{BIT}$ and bit-line voltage $V_{BL}$ is illustrated by FIG. 18. In this embodiment, the data location 64 is a floating gate transistor, so higher source-to-drain voltages $V_{BL}$ may tend to produce larger currents through the data location 64 $I_{BIT}$. This effect may depend, in part, on the charge on the floating gate $V_{FG}$, as indicated by the eight-different traces, corresponding to eight-different floating gate charges, labeled 0x through -7x, where x is an arbitrarily selected scaling constant.

For each of the traces, both the current at a given voltage and the overall shape of the trace may be distinct from the other traces. For example, in the trace corresponding to a floating gate charge of -6x, $V_{REF-LOW}$ produces a bit-line current $I_1$, and $V_{REF-HIGH}$ produces a bit line current $I_2$. Not only are both of these currents $I_1$ and $I_2$, considered alone, different from the $I_{BIT}$ through transistors with different $V_{FG}$ at the same $V_{BL}$, the relationship between $I_1$ and $I_2$ is also different for each $V_{FG}$. Specifically, in this embodiment, the slope of each trace changes depending on $V_{FG}$. Thus, in this embodiment, given the two coordinates represented by $I_1$ and $I_2$, each trace has three distinguishing characteristics: the value of $I_1$, the value of $I_2$, and the slope from $V_{REF-LOW}$ to $V_{REF-HIGH}$. This additional information about the response of the data location 64 to different voltages can be used to identify the floating gate charge and, thereby, read data.

Figure 19:
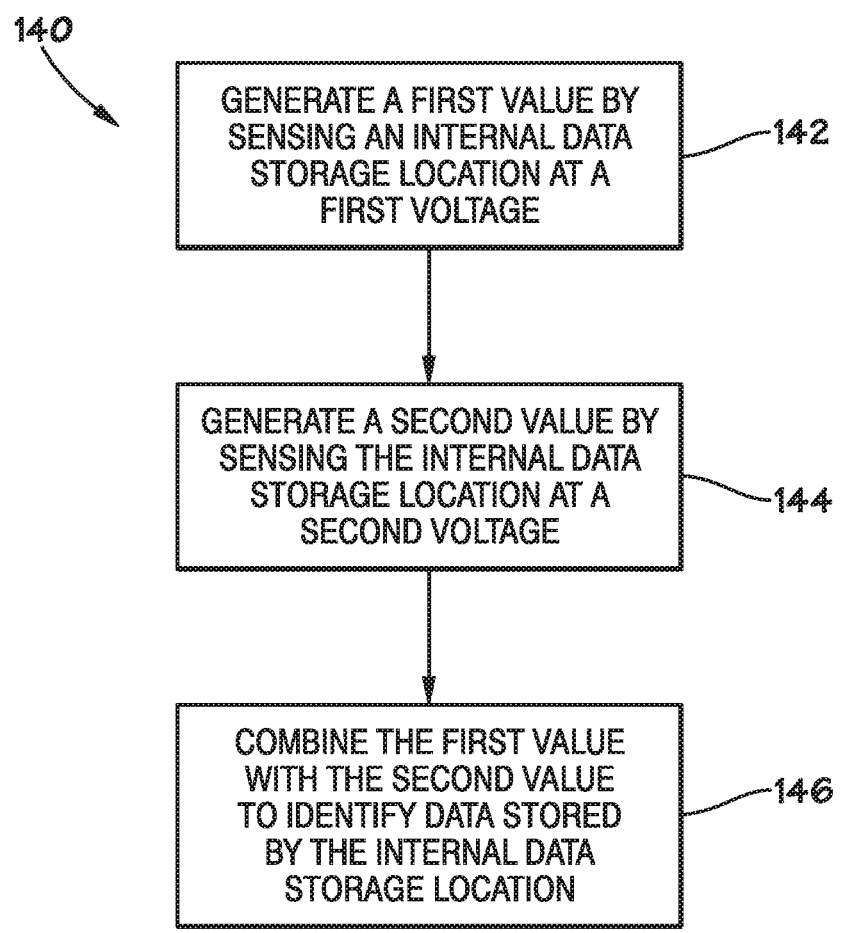
FIG. 19 is a flowchart illustrating the operation of the delta-sigma modulator of FIG. 16.

In some embodiments, the quantizing circuit 120 may read data by performing a sensing process 140 illustrated by FIG. 19. The illustrated process 140 begins with generating a first value by sensing a data location at a first voltage, as illustrated by block 142. In certain embodiments, generating the first value may include holding the data location 64 (FIG. 16) at a first voltage $V_{REF-LOW}$ with the delta-sigma modulator 88 and generating a first count (hereinafter referred to as $C_1$) based on a bit-stream output from the delta-sigma modulator 88.

After $C_1$ is generated, the controller 124 may signal the interfuser 124 to latch the output of the counter 90 and, thereby, receive the first value. Thus, the interfuser 124 may include memory. Also, in some embodiments, the controller 122 may reset the counter 90 to prepare the counter to generate a second value under different conditions.

Figure 16:
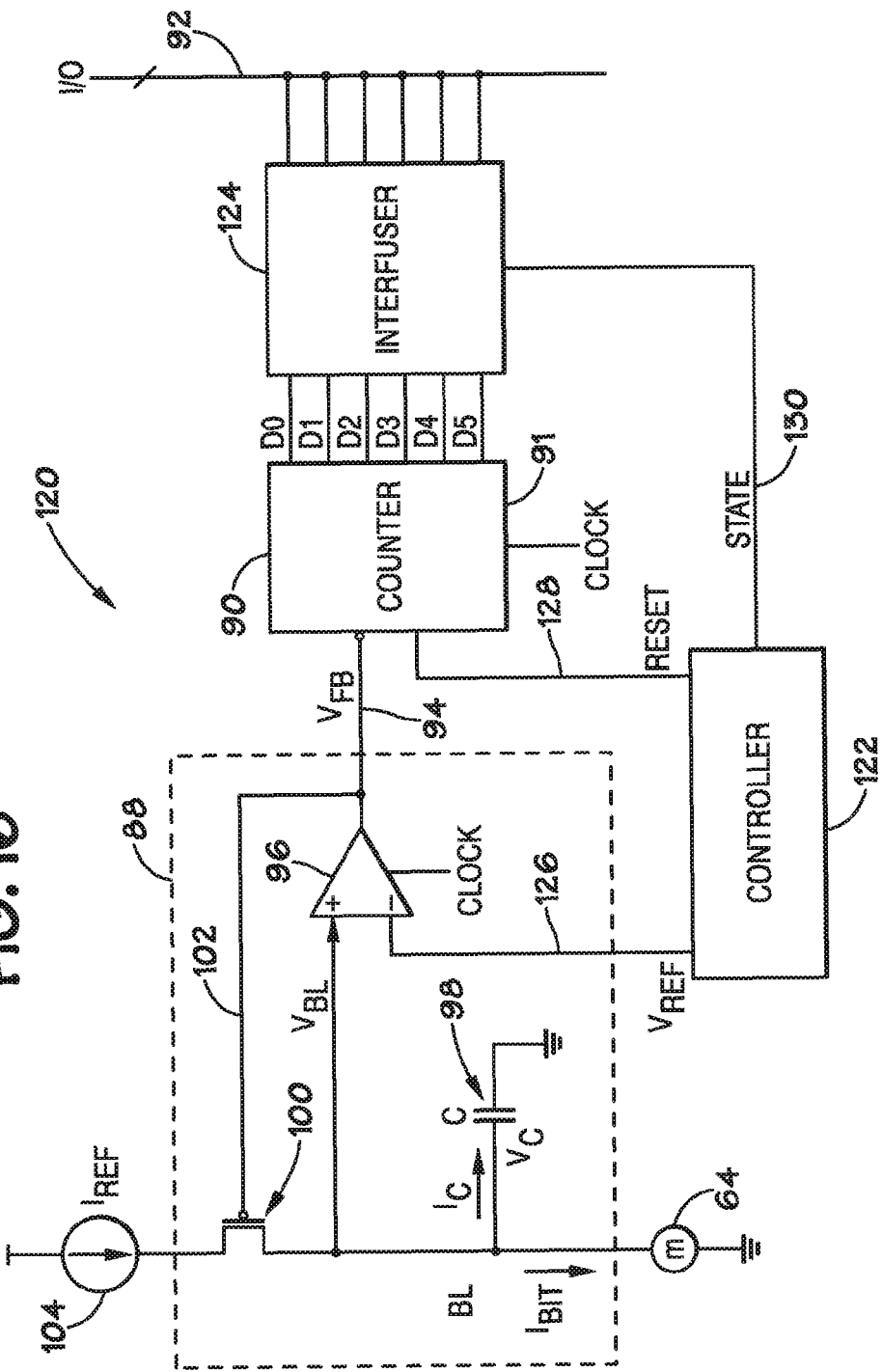
FIG. 16 illustrates an example of a delta-sigma modulator with a variable reference signal in accordance with an embodiment of the present invention.

Next in the process 140, a second value is generated by sensing the data location at a second voltage, as illustrated by block 144. The second value may be a count (referred to as $C_2$) from the delta-sigma modulator 88 (FIG. 16). In some embodiments, the second voltage may be different from the first voltage, e.g., higher, or lower. For instance, the second voltage may be $V_{REF-HIGH}$.

The second value may be generated generally consecutively with, e.g., immediately after, generating the first value. However, in some embodiments, there may be a waiting period between generating the first value and the second value. For example, the controller 122 in the quantizing circuit 120 (FIG. 16) may delay the start of the second count while the delta-sigma modulator 88 reaches steady state operation under the new reference voltage, $V_{REF-HIGH}$. In other embodiments, the second value may be added to the first value, and the counter 90 may continue counting as the reference voltage $V_{REF}$ changes.

After generating the first value and the second value, they may be combined to identify data stored by the data location, as illustrated by block 146 (FIG. 19). Combining these values may include applying the values to a data fusion algorithm, i.e., an algorithm that generates a single output value based on two or more input values. An example is described below in reference to the quantizing circuit 120 of FIG. 16.

After the second count $C_2$ is generated, the controller 122 may signal the interfuser 124 to latch the outputs of the counter 90 and receive the second count $C_2$, and this second value may be combined with the first value to identify the data stored by the data location 64. In some embodiments, the interfuser 124 may combine the first value with its second value according to an equation. That is, the data may be a function of $C_1$ and $C_2$, which are sensed under different conditions. Below, is an example of such an equation, in which $E_1$, $E_2$, and $E_3$ are empirically or analytically determined constants:

$$\text{Data} = E_1 \cdot C_1 + E_2 \cdot C_2 + E_3(C_2 - C_1)/(V_{REF\text{-}HIGH} - V_{RE\text{-}FLOW})$$

The constants $E_1$, $E_2$, and $E_3$ may be determined by testing or modeling the operation of a data location. The constants $E_1$, $E_2$, and $E_3$ may be selected to minimize the likelihood of an erroneous reading. By changing these values, different weights may be attached to different terms depending on its descriptive strength. In some embodiments, $V_{REF\text{-}HIGH}$ and $V_{REF\text{-}LOW}$ may be generally fixed or constant, and the reciprocal of their difference may be incorporated into the constant $E_3$.

In other embodiments, a variety of other equations or sensor fusion techniques may be employed to identify the stored data. Examples of other types of sensor fusion algorithms include a Kalman filter, a Bayesian network, or a neural network.

In some embodiments, additional values may be generated by sensing the data location 64 at other voltages. For instance, a third value may be generated at a third voltage, and a fourth value may be generated at a fourth voltage. These additional values may be combined with the first and the second values to identify data stored by the data location.

Other embodiments may read data by applying multiple stimuli to different kinds of data locations. For instance, the data location 64 may be a photo-diode, a CCD device, a CMOS image sensor, a phase change memory, a magneto-resistive memory, or other type of resistive memory.

Advantageously, the illustrated process 140 may combine the separate values to identify the stored data with greater precision than with an individual value. For example, sensing the floating gate transistor characterized in FIG. 18 at two different voltages may provide more information to select among the traces illustrated by FIG. 18 and determine the best-fit profile. Thus, by measuring a profile of the data location 64 (i.e., the response of the data location to a stimulus under changing conditions), the state of the data location can be identified with greater fidelity, and the stored data can be read more precisely.

Figure 20:
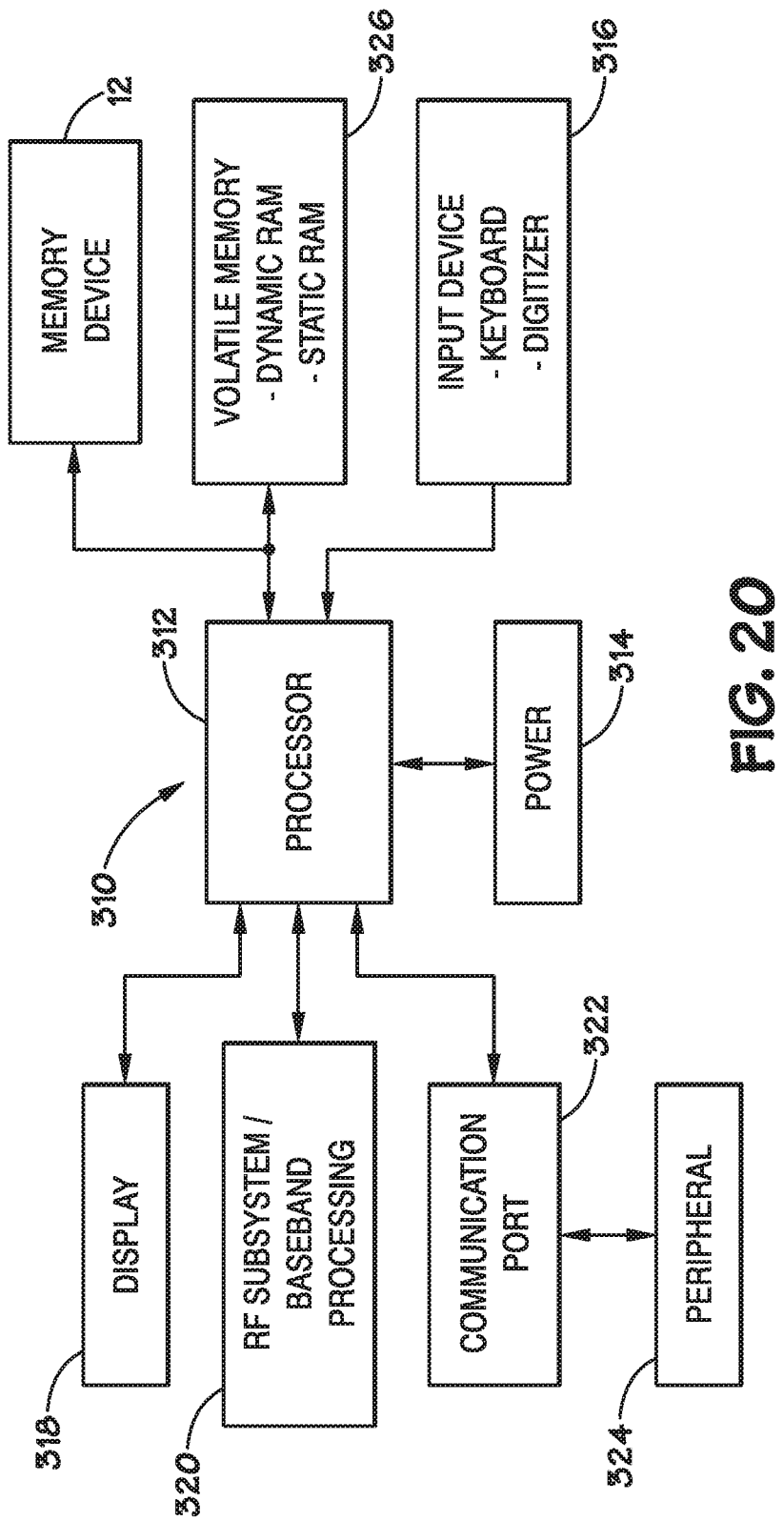
FIG. 20 illustrates an example of a system that includes the electronic device of FIG. 2.

FIG. 20 depicts an exemplary processor-based system 310 that includes the memory device 12 (FIG. 2). Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be coupled to the processor 312 depending on the functions that the system 310 performs. For instance, a user interface 316 may be coupled to the processor 312. The user interface 316 may include buttons, switches, a keyboard, a light pen, a mouse, a digitizer and stylus, and/or a voice recognition system, for instance. A display 318 may also be coupled to the processor 312. The display 318 may include an LCD, an SED display, a CRT display, a DLP display, a plasma display, an OLED display, LEDs, and/or an audio display, for example. Furthermore, an RF sub-system/baseband processor 320 may also be coupled to the processor 312. The RF sub-system/baseband processor 320 may include an antenna that is coupled to an RF receiver and to an RF transmitter (not shown). One or more communication ports 322 may also be coupled to the processor 312. The communication port 322 may be adapted to be coupled to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably coupled to the processor 312 to store and facilitate execution of various programs. For instance, the processor 312 may be coupled to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be coupled to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data. Additionally, the non-volatile memory 328 may include a high capacity memory such as a tape or disk drive memory.

The memory device 10 and volatile memory 326 may store various types of software, such as an operating system or office productivity suite including a word processing application, a spreadsheet application, an email application, and/or a database application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
   an internal data location; and
   a quantizing circuit coupled to the data location, wherein the quantizing circuit is configured to read data from the data location by sensing an output of the data location during changing conditions being applied to the data location.

2. The device of claim 1, wherein the quantizing circuit comprises a controller configured to generate a first reference voltage during a first condition of the changing conditions.

3. The device of claim 2, wherein the quantizing circuit comprises a comparator configured to receive the first reference voltage from the controller.

4. The device of claim 3, wherein the comparator is configured to receive a bit-line voltage related to the data stored in the data location.

5. The device of claim 4, wherein the comparator is configured to compare the bit-line voltage with the first reference voltage and output a value as the result of a comparison between the bit-line voltage and the first reference voltage.

6. The device of claim 5, wherein the controller is configured to generate a second reference voltage during a second condition of the changing conditions.

7. The device of claim 6, wherein the quantizing circuit comprises a comparator configured to receive the second reference voltage from the controller, compare a bit-line voltage related to the data stored in the data location with the second reference voltage, and output a value as the result of a comparison between the bit-line voltage and the first reference voltage.

8. A method, comprising:
   determining a first current passing through a data location coupled to a quantizing circuit based on a comparison of a voltage transmitted from the data location to the quantizing circuit with a first reference voltage;
   determining a second current passing through the data location coupled to the quantizing circuit based on a comparison of the voltage transmitted from the data location to the quantizing circuit and a second reference voltage; and
   determining a data value stored in the data location based on the first current and the second current.

9. The method of claim 8, wherein determining a data value comprises calculating a difference between the first current and the second current.

10. The method of claim 8, wherein determining a data value comprises combining the first current and the second current.

11. The method of claim 10, wherein combining the first current and the second current is accomplished via a fusion algorithm.

12. The method of claim 10, wherein combining the first current and the second current comprises applying the first current and the second current to a neural network.

13. The method of claim 10, wherein combining the first current and the second current comprises applying the first current and the second current to a Bayesian network.

14. The method of claim 8, wherein determining the second current is performed consecutively with determining the first current.

15. The method of claim 8, wherein determining the second current is performed after a predetermined period of time after determining the first current.

16. A device, comprising:
   a data location;
   a controller configured to generate a first reference voltage and a second reference voltage;
   an analog-to-digital converter coupled to the data location and the controller, wherein the analog-to-digital converter comprises a comparator configured to:
   compare a voltage of the data location with the first reference voltage; and
   compare the voltage of the data location with the second reference voltage.

17. The device of claim 16, wherein the comparator is configured to provide a first value related to the comparison of the voltage of the data location with the first reference voltage and provide a second value related to the comparison of the voltage of the data location with the second reference voltage.

18. The device of claim 17, comprising an interfuser configured to receive an first indication of the first value and a second indication of the second value.

19. The device of claim 18, wherein the interfuser is configured to combine the first indication with the second indication according to a data fusion algorithm.

20. The device of claim 19, wherein the interfuser is configured to output a result related to the combination of the first indication with the second indication, wherein the result is related to a state of the data location measured under changing conditions.

* * * * *